United States Patent
Van Dongen et al.

(10) Patent No.: US 11,281,110 B2
(45) Date of Patent: Mar. 22, 2022

(54) METHODS USING FINGERPRINT AND EVOLUTION ANALYSIS

(71) Applicant: ASML NETHERLANDS B.V., Veldhoven (NL)

(72) Inventors: Jeroen Van Dongen, Houten (NL); Wim Tjibbo Tel, Helmond (NL); Sarathi Roy, Eindhoven (NL); Yichen Zhang, Eindhoven (NL); Andrea Cavalli, Eindhoven (NL); Bart Laurens Sjenitzer, Eindhoven (NL); Simon Philip Spencer Hastings, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/973,395

(22) PCT Filed: May 20, 2019

(86) PCT No.: PCT/EP2019/062903
§ 371 (c)(1),
(2) Date: Dec. 8, 2020

(87) PCT Pub. No.: WO2019/233743
PCT Pub. Date: Dec. 12, 2019

(65) Prior Publication Data
US 2021/0255547 A1 Aug. 19, 2021

(30) Foreign Application Priority Data

Jun. 7, 2018 (EP) .................................... 18176544
Aug. 30, 2018 (EP) .................................... 18191756
Nov. 7, 2018 (EP) .................................... 18204781

(51) Int. Cl.
*G03F 7/20* (2006.01)

(52) U.S. Cl.
CPC .......... *G03F 7/705* (2013.01); *G03F 7/70616* (2013.01)

(58) Field of Classification Search
CPC ........................... G03F 7/705; G03F 7/70616
See application file for complete search history.

(56) References Cited

U.S. PATENT DOCUMENTS

| | | |
|---|---|---|
| 6,650,955 B1 | 11/2003 | Sonderman et al. |
| 2007/0028206 A1 | 2/2007 | Chou et al. |

(Continued)

FOREIGN PATENT DOCUMENTS

| | | |
|---|---|---|
| CN | 102540780 | 7/2012 |
| TW | 201506551 | 2/2015 |

(Continued)

OTHER PUBLICATIONS

International Search Report and Written Opinion issued in corresponding PCT Patent Application No. PCT/EP2019/062903, dated Jul. 24, 2019.

(Continued)

Primary Examiner — Steven Whitesell Gordon
(74) Attorney, Agent, or Firm — Pillsbury Winthrop Shaw Pittman LLP

(57) ABSTRACT

A method of determining a sampling control scheme and/or a processing control scheme for substrates processed by a device. The method uses a fingerprint model and an evolution model to generate the control scheme. The fingerprint model is based on fingerprint data for a processing parameter of at least one substrate processed by a device, and the evolution model represents variation of the fingerprint data over time. The fingerprint model and the evolution model are analyzed and a sampling and/or processing control scheme is generated using the analysis. The sampling control scheme provides an indication for where and when to (Continued)

take measurements on substrates processed by the device. The processing control scheme provides an indication for how to control the processing of the substrate. Also, there is provided a method of determining which of multiple devices contributed to a fingerprint of a processing parameter.

22 Claims, 12 Drawing Sheets

(56) References Cited

U.S. PATENT DOCUMENTS

| | | | |
|---|---|---|---|
| 2014/0089870 A1* | 3/2014 | Mos | G03F 1/36 716/54 |
| 2016/0062252 A1* | 3/2016 | Veeraraghavan | G03F 7/70625 702/150 |
| 2016/0077445 A1 | 3/2016 | Den Boef et al. | |
| 2016/0246185 A1* | 8/2016 | Ypma | G03F 7/70616 |
| 2016/0370710 A1 | 12/2016 | Wardenier et al. | |
| 2017/0242425 A1* | 8/2017 | Buhl | G05B 19/4188 |
| 2018/0067900 A1 | 3/2018 | Mos et al. | |
| 2019/0324371 A1 | 10/2019 | Van Der Logt et al. | |

FOREIGN PATENT DOCUMENTS

| | | |
|---|---|---|
| TW | 201708934 | 3/2017 |
| TW | 201812465 | 4/2018 |
| WO | 2015049087 | 4/2015 |
| WO | 2017194289 | 11/2017 |
| WO | 2018024446 | 2/2018 |

OTHER PUBLICATIONS

P.C. Hansen, "The L-curve and its use in the numerical treatment of inverse problems", www.sintef.no/globalassets/project/evitameeting/2005/lcurve.pdf (2005) (accessed on Dec. 8, 2020).

European Extended Search Report issued in corresponding European Patent Application No. 18176544.7, dated Dec. 14, 2018.

Taiwanese Office Action issued in corresponding Taiwanese Patent Application No. 107145167, dated Dec. 19, 2019.

* cited by examiner

METHODS USING FINGERPRINT AND EVOLUTION ANALYSIS

BACKGROUND

Cross-Reference to Related Applications

This application is the U.S. national phase entry of PCT Patent Application No. PCT/EP2019/062903, which was filed on May 20, 2019, which claims the benefit of priority of European Patent Application No. 18176544.7, which was filed on Jun. 7, 2018, and European Patent Application No. 18191756.8, which was filed on Aug. 30, 2018, and European Patent Application No. 18204781.1, which was filed on Nov. 7, 2018, each of which is incorporated herein in its entirety by reference.

FIELD OF THE INVENTION

The present invention relates to a method of determining a control scheme for a device configured to process and/or measure at least one substrate. The present invention also relates to a method for determining, for a substrate processed by multiple devices, which of the multiple devices contributed to a fingerprint of a processing parameter of said substrate. The present invention also relates to an associated computer program, and a system.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). A batch of substrates may be processed using the same devices in the same way. The integrated circuit is built up layer by layer with a lithographic step performed by a lithographic apparatus at each layer and other fab processes being performed in between lithographic steps.

Before the imaging step, various chemical and/or physical processing steps are used to form and prepare the layer for patterning. After the imaging step defines the pattern, further chemical and/or physical processing steps work through the pattern to create functional features of the integrated circuit. The imaging and processing steps are repeated in a multi-layer process to build integrated circuit.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

Modern multi-layer lithographic processes and products are so complex that issues due to processing are difficult to trace back to the root cause. Monitoring of wafer integrity and design of an appropriate correction strategy is therefore a time-consuming and laborious exercise.

International Patent Application WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints. This object data is used to obtain diagnostic information by performing a multivariate analysis to decompose the set of vectors representing the wafers in multidimensional space into one or more component vectors. Diagnostic information about the industrial process is extracted using the component vectors. The performance of the industrial process for subsequent wafers can be controlled based on the extracted diagnostic information.

In the fab, semiconductor process steps may thus leave their fingerprints on the product wafers. The lithographic apparatus has many in-line sensors, in addition to alignment sensors, that can measure these fingerprints. These include leveling sensors, sensors for aligning the reticle to the wafer stage chuck (e.g. "transmission image sensors" or "parallel integrated lens interferometer" type sensors) and sensors related to actuator stability. The lithographic apparatus' sensors are examples of sensors that can measure values of parameters spatially distributed across substrates. As well as a fingerprint representing the spatial distribution across the substrate, a fingerprint may represent a distribution of a process parameter across different wafers of a wafer lot. The term "process parameter" in this document needs to be read as any parameter associated with the semiconductor manufacturing process that may be relevant for a fingerprint of a (process) parameter fingerprint on a product unit (e.g. a substrate, wafer). A process parameter may hence be a parameter associated with a measurement performed by a sensor (for example within the lithographic apparatus or an etching apparatus) or (context) information related to a configuration of one or more of the apparatus used within the semiconductor manufacturing process (e.g. a certain etch chamber used for etching). For example a fingerprint obtained from "parallel integrated lens interferometer" sensors could represent a reticle heating signature across the wafer lot. Sensors can be used to characterize many or all individual processes (e.g. etch, deposition, develop track). This is possible as the scanner is involved at least once during fabrication of a layer on a wafer. The scanner can apply its sensors to all wafers passing through the lithographic process at least once per layer.

Via the many sensors, wafer, zone, field and die fingerprints may be derived from the wafers that are being exposed. It is useful to identify the fingerprints that are present on a certain set of layers on a wafer, and relate the presence of these fingerprints to processing and scanner context (to find the 'root cause') and expected on-product performance effects such as overlay, CD (critical dimension), focus, voltage contrast, CD-SEM, electrical tests (to determine 'yield impact').

Fingerprints referred to herein are the main systematic contributors (or "latent factors") of the measured signal. They are typically connected to the performance impact on-wafer or to previous processing steps. They can refer to wafer grid patterns (e.g. from alignment, leveling, overlay, focus, CD), field patterns (e.g. from intrafield alignment, leveling, overlay, focus, CD), wafer zone patterns (e.g. outermost radius of wafer measurements) or even patterns in scanner measurements related to wafer exposure (e.g. heating signature through-lot from reticle align "transmission image sensors" or "parallel integrated lens interferometer" type sensors measurements, temperature/pressure/servo profiles, etc.).

To obtain information to determine these fingerprints, measurements need to be taken to obtain information relating to the impact of various devices. However, the way in which measurements are taken may be inefficient. Taking measurements can affect the throughput of substrates and decrease efficiency of substrate processing. Improving the way in which measurements are taken can ensure that fewer unnecessary measurements are taken whilst carrying out enough measurements to maintain a desired level of accuracy of the processed substrates.

Measurement data referred to herein may be any measurements performed on the wafer and intended to be used for monitoring and control, e.g. leveling, alignment, overlay, CD, focus, SWA (side-wall angle), etc.

A fingerprint library referred to herein is a collection or set of fingerprints that may be encoded homogenously or heterogeneously.

SUMMARY

The inventors have devised a way to determine a control scheme to determine where and when measurements should be taken on a substrate and/or how a substrate should be processed. The inventors have also devised a way of determining a contribution to a fingerprint of a processing parameter.

The present invention provides a method of determining a control scheme for a device configured to process and/or measure at least one substrate, the method comprising obtaining a fingerprint model and an evolution model, wherein the fingerprint model is based on fingerprint data for a processing parameter of at least one substrate processed by a device, and the evolution model represents variation of the fingerprint data over time. The method further comprising analyzing the fingerprint model and the evolution model and generating a sampling control scheme for the device using the analysis, wherein the sampling control scheme provides an indication for where and when to take measurements on substrates processed by the device and/or generating a processing control scheme for the device using the analysis, wherein the processing control scheme provides an indication for how to control the substrate and/or processing of the substrate.

The present invention also provides a method of determining, for a substrate processed by multiple devices, which of the multiple devices contributed to a fingerprint of a processing parameter of said substrate, the method comprising obtaining a fingerprint model and an evolution model, wherein the fingerprint model is based on fingerprint data for a processing parameter of at least one substrate processed by a device, and the evolution model represents variation of the fingerprint data over time. The method also comprises analyzing the fingerprint model and the evolution model and determining, for a substrate processed by multiple devices, which of the multiple devices contributed to a fingerprint of a processing parameter of said substrate using the analysis and known processing parameter information of the multiple devices.

The present invention also provides a computer program comprising computer readable instructions to carry out the methods, and a system comprising a processor configured to carry out the steps of the methods.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
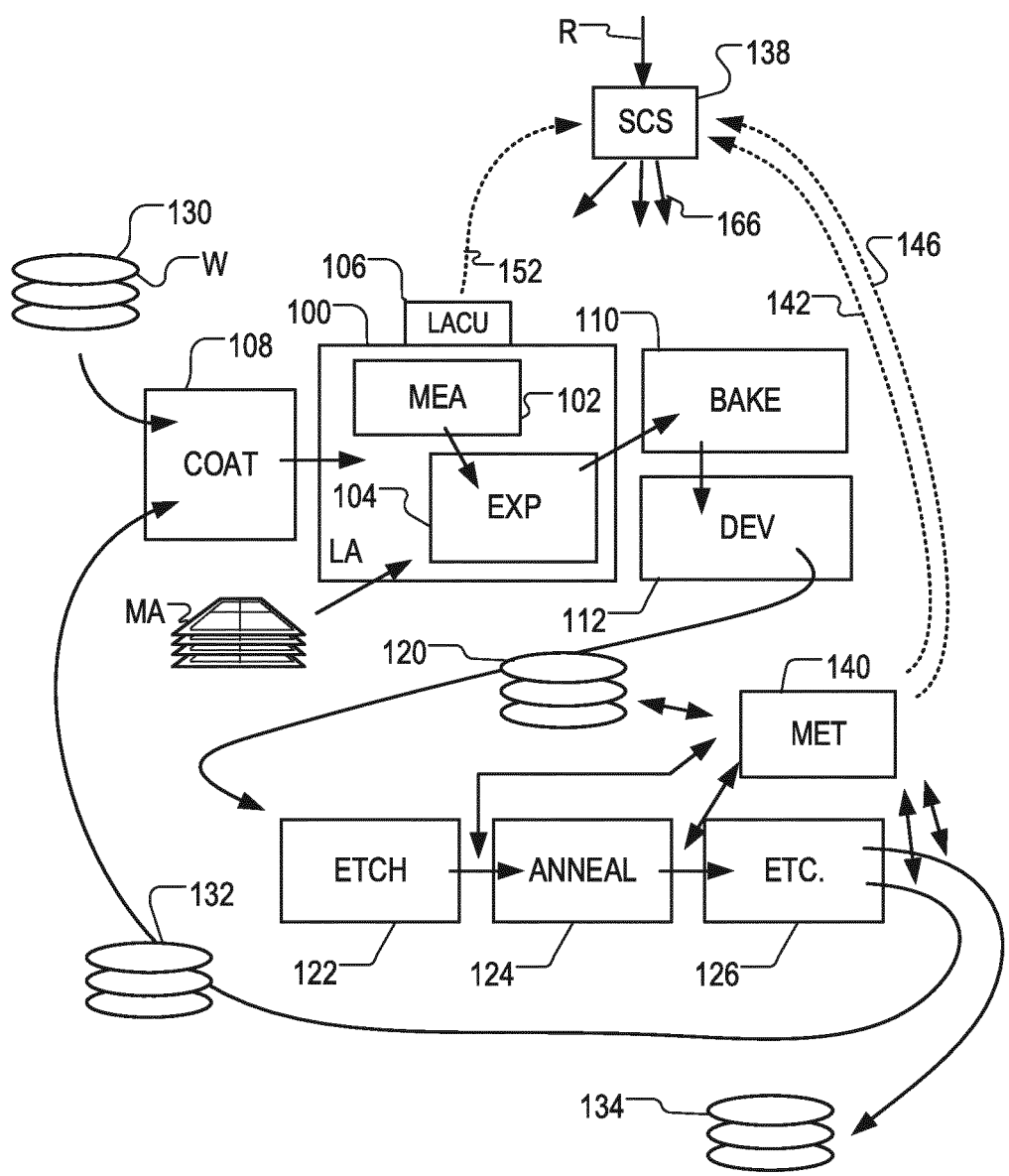
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and computing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments 166 over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Method for Determining Contribution of a Fingerprint

The following examples describe how a contribution of a device out of a plurality of devices can be determined. It is described in further detail below, how these examples can be used in an embodiment of the present invention.

In the example of a lithographic manufacturing process, the substrates are semiconductor wafers or other substrates to which patterns are to be applied in a patterning step, and structures formed by physical and chemical process steps.

Figure 2:
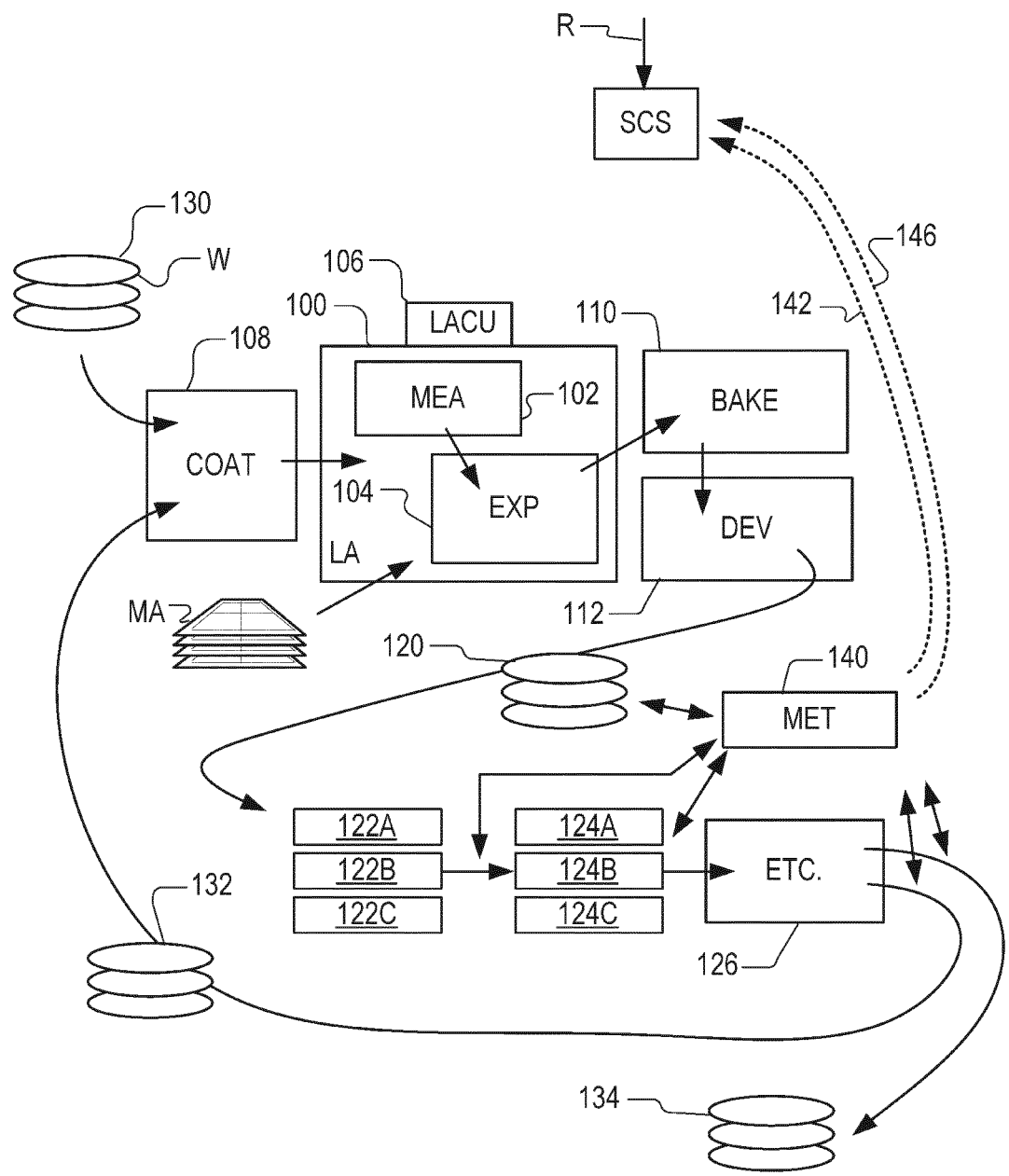
FIG. 2 depicts the lithographic apparatus of claim 1 in which plural devices are illustrated by way of example only.

In an example, a method is provided for determining a contribution of a device out of a plurality of devices to a fingerprint of a parameter associated with processing of a substrate. Thus, the contribution may be considered as a partial contribution or a relative contribution. The method will be described with respect to the devices shown in FIG. 2. As will be clear from FIG. 2, three etching devices are provided, 122A, 122B and 122C and three annealing devices are provided 124A, 124B and 124C. The substrate 120 having been processed in the lithographic apparatus, is then further processed in an etching step and annealing step. Other steps may also be included, for example a developing step as shown in FIG. 2.

For etching the substrate 120, the substrate 120 may pass through a first etching device 122A, a second etching device 122B or a third etching device 122C. For annealing the substrate 120, the substrate 120 may pass through a first annealing device 124A, a second annealing device 124B or third annealing device. Each of the different etching devices and annealing devices will have different influences on the fingerprint of the resulting substrate 134. The fingerprint may be a spatial fingerprint, and may be an intra-field and/or inter-field fingerprint, such as a substrate fingerprint, or a field fingerprint, a slit fingerprint or anything time or sequence wise.

As indicated above, the different devices and apparatus used can influence different substrates in different ways. When a substrate has been fully processed, such as substrate 134, even when measurements have been made of the parameters of the substrate, it is not necessarily clear how each of the different devices, e.g the different etching devices 122A, 122B or 122C and the different annealing devices 124A, 124B and 124C, have affected the fingerprint of a parameter of the substrate. As described above, even when plural different devices of the same type are used, they can affect a substrate in different ways. It is desirable to produce consistent substrates irrespective of the specific device used. Thus, it is desirable to determine the influence of the different devices on the substrate. It is beneficial to know how a device may affect a parameter on a substrate, for example, for diagnostic reasons or to improve control. This information may be used in different ways, for example to decide when a specific device needs to have alterations made to it or could be used as part of a feedback loop to control the processing of a substrate as is described in further detail below.

In this example, there is provided a method for determining a contribution of a device out of a plurality of devices to a fingerprint of a parameter, the parameter being associated with processing of a substrate. This may mean that the parameter is affected or controlled during processing of the substrate, or that the parameter results from the processing. The processing is carried out by the devices and may include various different processes, such as etching and annealing as described below. The method may be used in relation to a fingerprint on various different parameters. The parameter may be any parameter affected or controlled during processing of a substrate. For example, the parameter may be selected from a group comprising critical dimension, overlay, critical dimension uniformity, side-wall angle, line edge placement, alignment, focus, which may otherwise be referred to as levelling, pattern shift, line edge roughness, micro topology, and/or edge placement error (EPE). Additionally or alternatively, the parameter may be selected from a group comprising a shape description of a feature such as side-wall angle, resist height, and/or contact hole ellipticity. Additionally or alternatively, the parameter may be selected from a group comprising a processing parameter such as a coating thickness, optionally bottom anti-reflective coating thickness and/or resist thickness. Additionally or alternatively, the parameter may be selected from a group comprising a processing parameter which an optical property of a coating, which may optionally indicate a measure of absorption, such as refractive index and or extinction coefficient. Additionally or alternatively, the parameter may be selected from a group comprising a parameter determined from substrate measurements, such as yield parameters, optionally defects and/or electrical performance. The method may be applied to any one of these parameters and could be used on multiple parameters depending on which of the parameters are of most interest or importance to a particular user.

In this example there may be at least two different classes of devices. Only two classes are described, but additional classes may also be provided. The devices in a particular class may be used to carry out similar functions, such as etching or annealing as in the example illustrated in FIG. 2. In other words the devices in a given class are of the same type. For example, as shown in FIG. 2, at least two of the classes have at least two devices. This means that there may be at least two devices of the same type in at least two of the classes. The substrate may only be processed by one device in a first class of devices and/or one device in a second class of devices, e.g. the substrate might be processed by only one of the devices in at least one class, or even only one of the devices in each class.

In the example depicted in FIG. 2, there are several different classes of devices shown. For example, the etching devices 122A, 122B and 122C are each in a first class of device and the annealing devices 124A, 124B and 124C are each in a second class of device. As shown in FIG. 2, there are three etching devices and three annealing devices. Different numbers of classes, different numbers of device in each class and different combination of class and numbers in each class may be provided.

As there are a plurality of devices, it is desirable to determine the effect of an individual device. Thus, the method is for determining a contribution of a device out of the plurality of the devices. In this way, the impact of a single device can be calculated. As described, the parameter may relate to many things but most generally, the parameter is associated with processing of a substrate. Thus, the parameter is likely affected by processing the substrate and is thus likely to be affected in different ways by the different devices in the plurality of devices.

The method further comprises obtaining parameter data and usage data. The parameter data is based on measurements for multiple substrates having been processed by the plurality of devices. In further detail, the parameter data relates to measurements corresponding to the parameter for substrates processed by the plurality of devices. The usage data indicates which of the devices out of the plurality of devices were used in processing of a substrate. In other words, the usage data indicates which devices have been specifically used for processing each substrate. The usage data thus provides an indication of which individual devices, e.g. which particular device within a class of devices, has been used for processing a substrate. The devices used for processing the substrate can include the devices described above and shown in FIGS. 1 and 2, and to include some devices within the lithographic apparatus 100 used for processing the substrate, e.g. for example the substrate table used for exposing (in a dual stage lithographic apparatus).

The method further comprises determining the contribution using the usage data and parameter data. Thus, the method determines the contribution from one of the devices out of the plurality of devices to a fingerprint of a parameter associated with processing the substrate by using the above described data. This can be done in a variety of different ways.

In this example the method may further comprise using a matrix to determine the contribution. The matrix may refer to an array of quantities or expressions in rows or columns. The matrix may be part of a matrix equation which may be solved to determine unknown values in the equation. The method may comprise a step of determining a matrix using the usage data. The step of determining the contribution may comprise solving an equation comprising the matrix and using the parameter data. The matrix may represent the devices used to process multiple substrates. Thus the matrix may be used to define a relationship between the contribution of a device to a fingerprint of a parameter and the parameter data. This example may be used with any matrix solution method or variation thereof. As will be described in the examples below, the matrix equation may be solved to determine the contribution of a device out of a plurality of devices by multiplying a transformed version of the matrix with the parameter data, optionally wherein the transformed version of the matrix is the inverse of the matrix.

Determining the matrix may be done in a variety of different ways. Generally, each row of the matrix represents a substrate having been processed by at least one device in a first class of devices and at least one device in a second class of devices. Thus, each row represents a substrate having been at least partially processed. This means that each substrate which provides measurements being used to determine the impact of the devices has a single corresponding row in the matrix. This may correspond to the substrate having passed through at least one of the first class of devices and at least one of the second class of devices. In the example of FIG. 2, the first class of devices are the etching devices 122A, 122B and the second class of devices are the annealing devices 124A, 124B. Each column in the matrix may represent one of the plurality of devices. The substrate may only be processed by one device in any particular class, e.g. one device in the first class of devices and/or one device in the second class of devices.

As the substrate is processed, it will pass through different types of device, i.e. devices in different classes. Thus, the substrate may pass through at least one device in a variety of classes. The substrate may pass through at least one device in each of the classes. For each substrate, data can be collected and/or obtained to indicate which devices have been used to process that substrate. As described, this is the usage data. The usage data can be used to generate the matrix. The row of the matrix has a non-zero entry corresponding to each of the devices used to process that particular substrate. In other words, for each substrate, there is an entry in the matrix indicating which particular device from the plurality of devices have been used in processing that substrate. The entry may be a value, such as 1, or may be a sub-design matrix (which will be described in further detail below). In an example, the model may be solved for individual measurement locations, wherein the model per location is:

$$x_i = b_{etchA,i} + b_{annealB,i} \quad (1)$$

where i indicates the measurement number, i.e. indicates which substrate the measurement relates to. In this example, the parameter data x is based on at least one measurement from a substrate that has been processed by an etching device and an annealing device. A and B can indicate any of a particular etching and annealing device respectively. For example, A may be replaced with 1, and etch 1 may correspond to the first etching device 122A in FIG. 2, and B may be replaced with 2, and anneal 2 may correspond to the second annealing device 124B in FIG. 2. The symbols are not in bold because the parameters (e.g. the b's) are single values, and can be interpreted as decomposed measurements. All decomposed measurements may be fitted with a fingerprint model, if desired.

For individual measurement locations for multiple substrates, the multiple substrates may each be processed by at least one device. To solve equation (1), multiple equations are provided for different substrate, i.e. having different values of i. A matrix can be formulated based on the model for the multiple substrates and equation (1) can apply to each substrate. The parameter data based on measurements for the substrates at a particular location can be written as a vector, wherein $x=[x_1, x_2, x_3 \ldots x_n]$. Equations which are equivalent to equation (1) for each substrate can be combined as a matrix formulation. The matrix formulation of a linear model for estimating the fingerprint of a parameter can be represented as:

$$\mathbf{x} = \mathbf{M} \cdot \mathbf{b} \quad (2)$$

The symbols are in bold because they refer to vectors and a matrix. In this example, x is a vector based on measurements for multiple substrates having been processed by the plurality of devices, i.e. x is the parameter data, b is a vector of parameters of the linear model, and M is a matrix. A substrate is represented by a row of matrix, M, so the number of rows of the matrix, M, is the same as the size of the vector x. Each column may contain a basis function for one parameter in b, evaluated for all measurements, and each row may contains all basis functions evaluated based on measurements for one substrate.

In an example, six substrates (e.g. having parameter data $x_1, x_2, x_3, x_4, x_5, x_6$ respectively) are processed by a first etching device 122A, a second etching device 122B or a third etching device 122C, and a first annealing device 124A, a second annealing device 124B or a third annealing device 124C as shown in FIG. 2. The first substrate is processed using the first etching device 122A and the first annealing device 124A. The second substrate is processed using the second etching device 122A and the second annealing device 124B. The third substrate is processed using the first etching device 122A and the third annealing device 124C. The fourth substrate is processed using the third etching device 122C and the first annealing device 124A. The fifth substrate is processed using the second etching device 122B and the third annealing device 124C. The sixth substrate is processed using the third etching device 122C and the second annealing device 124B.

Each substrate has an equation corresponding to equation (1), and the combinations from the devices used for the different substrates can be applied in a matrix formulation as in equation (2). Thus, the matrix formulation of equation (2) may be written out in full for this example as follows:

$$\begin{pmatrix} x_1 \\ x_2 \\ x_3 \\ x_4 \\ x_5 \\ x_6 \end{pmatrix} = \begin{pmatrix} 1 & 0 & 0 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 0 & 1 \\ 0 & 0 & 1 & 0 & 1 & 0 \end{pmatrix} \cdot \begin{pmatrix} b_{etch1} \\ b_{etch2} \\ b_{etch3} \\ b_{anneal1} \\ b_{anneal2} \\ b_{anneal3} \end{pmatrix} \quad (3)$$

As described, each row of matrix, M, indicates a substrate and each column represents one of the devices. Thus, in this example, the matrix, M, may be generated to represent the first substrate in a first row, the second substrate in a second row and the third substrate in the third row, and so on. Furthermore, the first column may correlate to the first etching device 122A, the second column may relate to the second etching device 122B, the third column may relate to the third etching device 122C, the fourth column may relate to the first annealing device 124A, the fifth column may relate to the second annealing device 124B and the sixth column may relate to the third annealing device 124C.

The first substrate should have non-zero entries corresponding to the first etching device 122A and the first annealing device 124A. Thus, the first substrate (in the first row) has a non-zero entry in the first column and the fourth column of the matrix, M. As the first substrate was not processed by the second etching device 122B, third etching device 122C, the second annealing device 124B or the third annealing device 124C, the first row has zero entries in the second, third, fifth and sixth columns.

The second substrate should have non-zero entries corresponding to the second etching device 122B and the second annealing device 124B. Thus, the second substrate (in the second row) has a non-zero entry in the second column and the fifth column of the matrix, M. As the second substrate was not processed by the first etching device 122A, third etching device 12C, the first annealing device 124A or the third annealing device 124C, the second row has zero entries in the first, third, fourth and sixth columns.

The third substrate should have a non-zero entry corresponding to the first etching device 122A and the third annealing device 124C. Thus, the third substrate (in the third row) has a non-zero entry in the first and sixth column of the matrix, M. As the third substrate was not processed by the second etching device 122B, the third etching device 122C, the first annealing device 124A or the second annealing device 124B, the first row has zero entries in the second, third, fourth and fifth columns.

The entries in the matrix for the fourth, fifth and sixth substrate are determined in the same way. In this way, the usage data can be used to generate a matrix, M. The matrix, M, clearly indicates which of the plurality of devices have been used for processing a substrate. Thus a matrix, M, is determined as shown below which corresponds to the matrix in equation (3):

$$M = \begin{pmatrix} 1 & 0 & 0 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 0 & 1 \\ 0 & 0 & 1 & 0 & 1 & 0 \end{pmatrix} \quad (4)$$

The same equations as above may be applied for more complicated models, such as when the parameter data is based on measurements which are preprocessed. In an example, the model of contributions from different devices can be written as follows:

$$x = M_A \cdot b_A + M_B \cdot b_g \quad (5)$$

wherein A and B are labels of a first and second device. The model can be different for the devices A and B, and can have different numbers of parameters, which would lead to different sizes of the vectors b, and different number of columns of the matrices, M. As before, x is also a vector. This example corresponds to the equation (1) but using sub-design matrices.

Solving equation (5) requires more than one set of measurements. Thus, the parameter data is based on measurement for multiple substrates, which as shown in equation (6) may be a first and second substrate:

$$\begin{cases} x_1 = M_{A,1} \cdot b_A + M_{B,1} \cdot b_B \\ x_2 = M_{A,2} \cdot b_A + M_{B,2} \cdot b_B \end{cases} \quad (6)$$

the numerical subscripts indicate the substrate which has been processed, and A and B are labels of the devices used to process that substrate, as in equation (5). Each equation in (6) may relate to a model/fingerprint for one substrate, i.e. relating to multiple locations on a single substrate.

Equation (6) can be rewritten as:

$$\begin{pmatrix} x_1 \\ x_2 \end{pmatrix} = \begin{pmatrix} M_{A,1} & M_{B,1} \\ M_{A,2} & M_{B,2} \end{pmatrix} \cdot \begin{pmatrix} b_A \\ b_B \end{pmatrix} \quad (7)$$

which shows how the design matrix may be composed of multiple sub-design matrices, e.g. $M_{A,1}$, $M_{A,2}$ ... etc. Each sub-design matrix may be generally written as $M_{X,i}$ where i indicates the substrate and X indicates the device use on the substrate. The sub-design matrix, $M_{X,i}$ is a matrix within the design matrix, M. This mechanism of combining two linear models can be extended to include more contributor models for additional substrates and/or devices. The sub-design matrix may be a zero entry sub-design matrix or a non-zero sub-design matrix. A zero entry sub-design matrix may correspond to the devices out of the plurality of devices not used to process the substrate. The zero entry sub-design matrix may be a matrix comprising only 0 entries. The sub-design matrices in a single matrix may all be the same size, such that the zero-entry sub-design matrix and the non zero-entry sub-design matrix are the same size. A non-zero sub-design matrix may correspond to each of the devices used to process the substrate. The non-zero entry sub-design matrix may be based on a modelled contribution to the fingerprint from the respective device and substrate. In other words, the non zero-entry sub-design matrix may include information modelling the contribution on a particular substrate from a particular device. The zero entry sub-design matrices may be used in place of the zero entries in the matrix described above and the non zero-entry sub-design matrices may be used in place of the non zero entries in the matrix described above.

In the present example, for every substrate, a model with one term for each class of devices used on that substrate is created, for example:

$$\begin{pmatrix} x_1 \\ x_2 \\ x_3 \\ x_4 \end{pmatrix} = \begin{pmatrix} M_{etch1,1} & 0 & M_{anneal1,1} & 0 \\ 0 & M_{etch2,2} & 0 & M_{anneal2,2} \\ M_{etch1,3} & 0 & 0 & M_{anneal2,3} \\ 0 & M_{etch2,4} & M_{anneal1,4} & 0 \end{pmatrix} \cdot \begin{pmatrix} b_{etch1} \\ b_{etch2} \\ b_{anneal1} \\ b_{anneal2} \end{pmatrix} \quad (8)$$

In this example, etch indicates a first class of devices, i.e. etching devices, and anneal indicates a second class of devices, i.e. annealing devices. The 0 matrices have dimensions which correspond to the matrices, $M_{X,i}$.

Each of the plurality of devices may be used to process at least one of the multiple substrates. In other words, to solve the equation comprising the matrix to determine the contribution from a device out of a plurality of the devices, the device must have been used on at least one of the substrates in the matrix. The fewer combinations of devices there are, the greater the uncertainty in the resulting determination.

Although the etching and annealing devices are used as examples described above, any different type of device (as well as any numbers of devices in one type and any number of different types of device) may be used. The device may be any device which impacts a parameter described above. Thus the different types could include etching devices, deposition tools, substrate tables, polishing devices, such as chemical-mechanical planarization devices, annealing devices, such as rapid thermal annealing devices, cleaning devices, coating devices, such as those used to apply a resist, developing devices, track devices, implantation devices and/or baking devices. As would be understood, any combination of devices may be applicable and may be used on the substrate. Determining the contribution may increase in complexity as the number of devices increases but would still be possible using the matrix method described.

The parameter data may relate to the measurements in different ways (the measurements may otherwise be referred to as measurement data). In an example, the parameter may be the same as the measurements. In other words, no pre-processing of the measurements may be carried out and the contribution may be determined using the parameter data without initial processing. Alternatively the measurements could be processed using a variety of different methods to provide the parameter data. In other words, the parameter data is based on processed measurements. For example, the measurements can be processed by using principal component analysis or fitting a model to the measurements, preferably a polynomial model, and more preferably a linear model, e.g. using Zernike analysis. Using Zernike analysis may use sub-design matrices as described above. Principal component analysis (e.g. using statistical or spatial correlation) may have the advantage of filtering noise. Statistical correlation may be used which may only be based on major fingerprints which suppresses differences that are small or not correlating between substrates. The parameter data which is based on processed measurements may result in sub-design matrices as described in relation to equations (5) to (8).

Different types of fit may be used and they may be effective for suppressing noise. Thus, the parameter data may be a model based on measurement for the substrates having been processed by the plurality of devices. This may decrease the number of measurements needed whilst still providing usable parameter data with accuracy to a desired degree.

The equation comprising the matrix may be solved using a variety of different methods. Most generally, the matrix equation can be solved by multiplying a transformed version of the matrix with the parameter data. For example, equation (2) above can be solve using standard linear algebra techniques, e.g. the equation comprising the matrix can be solved using a least squares fit:

$$b=(M'\cdot M)^{-1}\cdot M'\cdot x \quad (9)$$

and a similar method may be applied to equation (7). The advantage of using a least squares fit is that this may be quicker than other methods and it can be solved without explicit matrix inversion, using e.g. Penrose pseudo-inverse, or QR decomposition. Additionally, the above equations, e.g. equations (2) and/or (7), may be adapted to include an indication of noise variance such that noise variance has a reduced effect. However, it won't work on an undetermined system and there may be overfitting. In case the M'M matrix is almost singular, alternative techniques exist to make the problem more easily solvable, e.g. singular value decomposition (SVD).

Singular value decomposition may be used based on the following theorem in which:

$$M=U_{m\times m}S_{m\times k}V_{k\times n} \quad (10)$$

Where U and V are each unitary matrices, $U^T U=I_{n\times n}$ and $V^T V=I_{p\times p}$ (i.e. U and V are orthogonal), and S is a diagonal matrix. The subscript m and n values represent the number of rows and columns of each matrix respectively, i.e. U is an m by m matrix and S is an m by k matrix. This can be applied to the above equations such that:

$$x_{m\times p}=U_{m\times m}S_{m\times k}V_{k\times n}b_{n\times p} \quad (11)$$

This equation can be solved to provide the following solution:

$$b=V_k(S_k^T S_k)^{-1}S_k^T U^T x \quad (12)$$

Part of the problem is that the matrix is likely to be overdetermined, meaning that there is not necessarily one simple solution. This means that inverting the matrix often won't work. For any solution, an infinite number of alternative solutions may be created by adding an arbitrary number or vector to all b or b of one group, while simultaneously subtracting the same number of vector from the b or b of another group.

One useful way to overcome this is to make the average contribution of a class of devices zero, and the average fingerprint is in a new b or b.

Referring to the above equations, this means that an additional $b_{global}$ is added to the model and there will be following two additional constraints which can be handled during solving the model:

$$b_{etch1}+b_{etch2}=0 \quad (13)$$

$$b_{anneal1}+b_{anneal2}=0 \quad (14)$$

This example of including additional constraints is based on adapting equation 8 described above.

Alternatively, the additional constraints may be made explicit in the matrix, by removing one of the columns of each group, and adding −1 in the remaining columns of that group, in case the measurement or substrate has the removed columns contributor label. In addition, the removed contributors' b or b are also removed. In the next example, based on equation (3), the last contributor of each group is removed:

$$\begin{pmatrix} x_1 \\ x_2 \\ x_3 \\ x_4 \\ x_5 \\ x_6 \end{pmatrix} = \begin{pmatrix} 1 & 1 & 0 & 1 & 0 \\ 1 & 0 & 1 & 0 & 1 \\ 1 & 1 & 0 & -1 & -1 \\ 1 & -1 & -1 & 1 & 0 \\ 1 & 0 & 1 & -1 & -1 \\ 1 & -1 & -1 & 0 & 1 \end{pmatrix} \cdot \begin{pmatrix} b_{global} \\ b_{etch1} \\ b_{etch2} \\ b_{anneal1} \\ b_{anneal2} \end{pmatrix} \quad (15)$$

After the system is solved, $b_{etch3}$ may be calculated as $-(b_{etch1}+b_{etch2})$; likewise, $-(b_{anneal3}$ is $b_{anneal1}+b_{anneal2})$.

The equation comprising the matrix can also be solved using a least squares fit based on regularization. Optionally, an L-curve method and/or leave-one-out cross validation method may be used. Regularization techniques may be used to prevent overfitting. These methods may be beneficial in suppressing randomness, which might include measurement noise and/or other contributors. Use of an L-curve method is described in "The L-curve and its use in numerical treatment of inverse problems" by P. C. Hansen (https://www.sinief.no/globalassets/project/evitameeting/2005/1curve.pdf), which is hereby incorporated by reference in its entirety. Regularization generally limits the range of fitted parameters, e.g. reducing high frequencies, and it still allows use of the full model, e.g. the mixing model, but implicitly suppresses noise in the measurements. For example, regularization techniques, such as ridge regression can be used to reduce or minimize fit error. Such techniques may be used based on the following equation:

$$b=(M^T M+\lambda I)^{-1}M^T x \quad (16)$$

In brief, for a set of lambdas (λ), the procedure comprises a step of leaving out one wafer for all combinations (so wafers 1-19, wafers 1-18+20, etc.) and solving the model in equation (16) with a particular lambda. Further steps include calculating the fit error on the left-out wafer, calculating the average fit error, plotting the average fit error against lambda and choosing a lambda with the smallest fit error. The equation comprising the matrix can also be solved using Bayesian statistics which have the advantages of avoiding overfitting, prior knowledge can be systematically incorporated and a distribution of the result can be provided rather than a single point. However, heavy computational processing may be required and there may be large memory requirements.

The case of multidimensional measurements (e.g. overlay), the above methods can be applied separately on x and y.

In the above example, an entry in the matrix may simply be 1 (as the non-zero entry) or a zero indicating the specific device used to process a particular substrate. However, the matrix may comprise at least one sub-design matrix as shown in equations (5)-(8). In other words, an entry in the matrix may comprise a further matrix. For example, the simpler matrix may be used when the parameter is determined at an individual location and the matrix may be more complex, for example by using sub-design matrices when processing multiple locations. The content of the sub-design matrix content can vary, for example different sub-design matrices may be used for different classes, e.g. an offset/curvature for one class of devices and global for another class of devices.

It is described above that the non-zero entry may be a 1 or a sub-design matrix. This is preferable to aim for ideal decomposition. However, in practice, fingerprints may cross correlate, in which case the non-zero entries may have values other than 1. For example, the values may be weights. Thus, for example, the values in the M matrix (equation 4) may comprise zero entries, and non-zero entries, wherein the non-zero entries are not limited to 1.

In the above described example, a matrix can be determined and then used for determining the contribution of a device, out of a plurality of devices, to a fingerprint of a parameter. As described, there are several ways in which the matrix can be determined. The above-described method seeks to find incorrect disturbance sources which negatively impact on parameters of printed substrates W. Measurements of the substrate W can be decomposed based on context data to work out the contribution of a specific device. In this way, the method can be used to determine what affects a parameter of a printed substrate with relatively good accuracy. In this way, negative contributions to a parameter from a specific device can be accounted for, i.e. minimized and/or corrected.

A sufficiently information-rich data set may be used to properly decompose the fingerprint of a parameter to determine the contribution of a particular device. This may mean that a relatively large set of data is needed, which can be costly. In other words, a possible issue is that a large number of substrates W may need to be processed in a variety of different ways and then measured in order to determine the specific fingerprint for any one device. Additionally, there may be a relatively large amount of redundant data in the data set. In order to get the required data set, sampling periodically/randomly etc. could be used to reduce the number of substrates which need to be processed and measured. However, a better data set could be provided by using a more focused method as described below. The method might indicate where measurements should be carried out and on how many substrates W. Thus, the method may comprise steps to optimize the determination of the matrix so that fewer substrates W need to be used to determine the contribution of the different devices.

In further detail, the matrix can be determined in a specific way to provide advice for customers about which substrates W should be measured and/or which devices should be used to process substrates to measure a useful number of substrates in the shortest amount of time and/or to advise customers how to extend a data set with a reduced or minimal number of substrates, as an addendum to a data set already gathered, e.g. by determining which devices to use to process selected additional substrates.

Most generally, the method for determining the matrix is for selecting a thread of process steps applied to multiple substrates. This means that the matrix may be used for selecting which combination of devices should be used to process individual substrates in a selected group of substrates. The method comprises selecting a first thread (e.g. a first combination of devices for processing a substrate) which may correspond to a row in the matrix. The method may further comprise selecting at least one further thread (e.g. at least one further combination of devices for processing at least one further substrate) based on an expected improvement with which a characteristic of a process step associated with the first thread and the second thread can be determined.

In further detail, in this example, the method for determining the matrix may further comprise of the following steps, which are preferably provided in the following order:

a. generating a first matrix, N, representing the possible combinations of the plurality of devices used to process a substrate W;

b. determining a vector, $n_i$, for each row, i, of the first matrix, N;

c. calculating a delta covariance matrix, $\Delta Y_i$ for each row, wherein the delta covariance matrix is $n_i^T n_i$;

d. selecting a row, i, from the first matrix, N, and storing the selected row as a second matrix, M;

e. determining if a stopping criteria has been met, wherein: if the stopping criteria is not met, continuing with step f using an updated first matrix, N, in which the selected row is removed; and if the stopping criteria is met, using the second matrix, M, as the determined matrix;

f. calculating the pseudo-determinant corresponding to each remaining row of the updated first matrix, N;

g. determining a row with a preferred pseudo-determinant, updating the second matrix, M, to include the row with the preferred pseudo-determinant, and updating the first matrix, N, by removing the row with the preferred pseudo-determinant;

h. determining if a stopping criteria has been met, wherein:

if the stopping criteria is not met, returning to step f using an updated first matrix, N, in which the row with the preferred pseudo-determinant is removed; and if the stopping criteria is met, the updated second matrix, M, is used as the determined matrix.

Determining the matrix in this way means that it might be possible to determine how the parameters of a printed substrate W have been affected whilst using the minimal number of test substrates. This method provides a sampling scheme optimization which allows selection of metrology targets to generate informative measurements with minimal metrology load. Therefore, using this method means that the metrology load (i.e. the number of substrates which need to be measured) for a customer can be reduced whilst still providing a matrix which is beneficial to the user.

The above described method provides guidance to a customer about which substrates, having been processed by which specific devices, to measure based on the contents of the second matrix, M. This is beneficial in that it minimizes measurement effort for a customer whilst enabling good accuracy in the estimated contribution. This provides a cost-effective alternative to measuring additional substrates.

In the present method, substrates W can be processed according to an optimal, possibly limited, combination of threads (i.e. a specific combination of devices for processing individual substrates) which means that only measurements from these substrates are used. This selection of the most informative threads yields accurate context specific fingerprint determination. The covariance analysis techniques used in the above described steps do not generally require a large amount of computational processing to execute. Furthermore, this method is advantageous in that if a large number of substrates W have been processed for a large number of threads, the method may be used to guide which performance parameter measurements should be carried out to determine context specific fingerprint information.

It should be noted that the first matrix, N, uses usage data indicating which of the devices out of the plurality of the devices were used in the processing of each substrate. Thus, the first matrix, N, may represent all the possible combinations of the plurality of devices used to process a substrate.

The first matrix N may otherwise be referred to as a context mixing matrix, i.e. a matrix holding all possible context paths a substrate can traverse, i.e. all the different possible combinations of devices which may be used to process a substrate. The vector $n_i$ for the ith row vector may otherwise be referred to as the ith row vector. When the first row is added to the second matrix, M, this may be referred to as initialising a sampling scheme, wherein a sample of the first matrix, N, are used to form the second matrix, M.

The size of the delta covariance matrix, $\Delta Y_i$ for each row may be based on the size as the first matrix, N. If the matrix N is of dimension n_a by n_b, then $\Delta Y_i$ is of size n_b by n_b, i.e. a square matrix with the same number of rows and columns. As described, n_b may be the amount of devices, whereas n_a may indicate the plurality of combinations of devices.

When the rows are selected from the first matrix, N, and stored in the second matrix, M, the new rows may be appended to the second matrix, M, at the bottom of the second matrix, M. Thus, in this way, the rows can be transferred from the first matrix, N, to the second matrix, M, and the rows being added to the second matrix, M, can be added in an ordered way. This is advantageous because if the second matrix, M, needs to be truncated at a later date, for example if a user needs to further limit the number of substrates tested, then the second matrix, M, can be reduced whilst maintaining the optimum rows at the top of the second matrix, M. Additionally, if the rows are added to the second matrix, M, in an ordered way, then this may allow a user to more easily evaluate the preferred size of the experiment. For example, a certain parameter of interest may be compared to the number of substrates/different combination of processing devices used on the substrates. For example, the parameter may be plotted on a function of the "size" of the experiment. This could be used to check how many rows of M are needed to pass a certain threshold, i.e. meet a stopping criteria. Then this denote the "size" of your experiment (e.g. the number of substrates you need to sample).

The method described above essentially uses steps f to h to probe each of the rows remaining in the first matrix, N, to determine which of the rows is the most valuable. The most valuable row is then added to a further matrix. The further matrix is the second matrix, M. In other words, the second matrix, M, can be used in the linear equation in the example as described above. The second matrix, M, can be later used to determine the contribution of a device out of a plurality of devices. When a row is removed from the first matrix, N, the process is repeated and the remaining rows are then probed to determine which of the remaining rows is the most valuable. The next most valuable row is then added to the second matrix, M. In this way, the most valuable rows of the first matrix, N, can be added to the second matrix, M, until a stopping criteria is met. The stopping criteria can be selected or predetermined depending on a variety of different options as described below.

As described above, the pseudo-determinant for each row is calculated to determine the row with the preferred pseudo-determinant. The pseudo-determinant is calculated by adding the delta covariance matrix, $\Delta Y_i$, for each row to a third matrix, Y, wherein the third matrix, Y, is the covariance of the second matrix, M. Further to this, the determinant of the sum of the third matrix, Y, and the delta covariance matrix for the row, $\Delta Y_i$ can then be calculated. Thus, the determinant of $Y+\Delta Y_i$ is calculated. In every iteration, i.e. for each row i out of the first matrix, N, the pseudo determinant of $Y+\Delta Y_i$ must be evaluated. This equates to the sum of the covariance of the current second matrix, M, and $\Delta Y_i$ (for row i of the first matrix, N). This calculation is carried out for all rows i of the first matrix, N. The third matrix, Y, is kept track of, and represents the covariance of the second matrix, M. Thus, whenever the second matrix, M, is updated, the third matrix, Y, is also updated accordingly.

A row of the first matrix, N, may represent a possible combination of the plurality of devices used to process a substrate. A column of the first matrix, N, may represent one of the plurality of devices. In this case, a row of the first matrix, N, may have a non-zero entry corresponding to each of the plurality of devices used to process the substrate represented by that respective row. Similarly, the first matrix, N, may have a zero entry corresponding to each of the plurality of devices not used to process the substrate represented by that respective row.

It is described above that the preferred pseudo-determinant is determined and then included in this second matrix, M. The preferred pseudo-determinant may otherwise be referred to as the optimum pseudo-determinant. The preferred pseudo determinant may be considered to be the pseudo-determinant with the highest value. In other words, the row n out of the first matrix, N, which attained the highest pseudo determinant may added to the second matrix, M. Other alternatives may also be used. For example, the trace of $inv(Y+\Delta Y_i)$ could be used (the trace is the sum over the diagonal elements). In this case, the row with the minimum value of the trace may have the preferred pseudo-determinant. Alternatively, a value of v_j could be minimized with v_j=sqrt(x_j*inv($Y+\Delta Y_j$)*x_j'), with x_j being the j_th row out of the combined [M;N] matrix. In this case, the row with the maximum value of v_j may have the preferred pseudo-determinant.

After the delta covariance matrix for each row is calculated, a row is selected (as the first selected row) from the first matrix, N. The row that is first selected may be the first row of the first matrix, N. This is not necessary, however, it simplifies the process in that the first selected row is simply the first row of the first matrix, N.

As described above, the process for determining the matrix may be stopped if a stopping criteria is met. The stopping criteria could be based on a variety of different selected criteria. The stopping criteria may otherwise be referred to as a key performance indicator. The stopping criteria may have a predetermined or selected value. Although, this value may be altered, for example, depending on the selection of a user.

In further detail, the stopping criteria may be met if the number of rows used in the second matrix, M, reaches a predetermined value. Additionally or alternatively, the stopping criteria may be met if all rows of the first matrix, N, are used in the second matrix, M. Additionally or alternatively, the stopping criteria may be met if a value of a performance parameter reaches a predetermined value. The performance parameter may be any parameter relating to the substrate. For example, the performance parameter may be selected from a group comprising: i. critical dimension, overlay, critical dimension uniformity, line edge placement, alignment, focus, pattern shift, line edge roughness, micro topology, and/or edge placement error; and/or ii. a shape description of a feature, such as side-wall angle, resist height, and/or contact hole ellipticity; and/or iii. a processing parameter such as a coating thickness, optionally bottom anti-reflective coating thickness and/or resist thickness, and/or an optical property of a coating which may optionally indicate a measure of absorption, such as refractive index and/or extinction coefficient; and/or iv. a parameter determined from substrate measurements, such as yield parameters, preferably defects and/or electrical performance. It will be understood that a user may select other stopping criteria which may be used in addition or as an alternative to the stopping criteria described here.

When all the rows of the first matrix N are used, the rows may still be effectively sorted in the second matrix, M, by relevance because the most optimal rows may be provided towards the top of the second matrix, M. Thus, the list of rows in the second matrix, M, could be later truncated to a reduced size. In other words, when all of the rows of the first matrix, N are used in the second matrix, M, the resulting matrix could be later truncated resulting in the same effect as other stopping criterion, such as a predetermined data set.

The above steps of the method includes various determining, calculating and selecting steps. It will be understood that the data used during and after each of these steps may be stored in an appropriate data storage medium (e.g., semiconductor memory, magnetic or optical disk).

A second example is provided in which the contribution is determined without requiring the use of a matrix (although a matrix equation may optionally be used). The second example is the same as the first example except for the use of the matrix. The second example may comprise the step of analyzing variation of the parameter data using the usage data, i.e. carrying out "Analysis of Variation" (ANOVA) on the measurement data. In this example, the general idea is to evaluate the variation between the measurement data when grouping the measurement data according to the usage data. Thus, the method of the second example comprises determining the contribution to the parameter for each device by grouping the measurement data using the analysed variation. In addition the contribution to a fingerprint from the various parameters can be assessed using a fingerprint model. This is done most efficiently with a model of the fingerprint based upon principal component analysis coefficients (also called loading) of the data.

For determining a contribution of a device to a fingerprint of a parameter, the ANOVA procedure (e.g. Matlab "anovan") per measurement location, and retrieving for each class of device the difference between the mean of the group measurements per device and the global mean, and taking that as the decomposed measurements. All decomposed measurements may then be fitted with a fingerprint model, if desired.

The method in either of the first or the second example may be used to control a device. At least one of the devices may be controlled based on the determined contribution to the fingerprint of the parameter of that device. Thus, the determined contribution for a device may be used to alter the way in which the processing of a substrate is carried out by that device. In other words, any error or variation in fingerprint which is undesirably induced by a specific device may be reduced or eliminated by controlling the device based on its determined parameter contribution. Additionally or alternatively, other devices including litho tool 100 may be controlled based on the determined parameter contribution. As described, the parameter may many different things. The parameter may be any parameter that directly or indirectly influences the control applied by a device.

It is described above that a row of the matrix may represent a substrate, and in particular, a substrate having been processed by at least one device in a first class of devices and at least one device in a second class of devices, and a column represents one of the plurality of devices. However, it will be understood that the rows and columns may be switched. Thus, a row of the matrix may represent one of the plurality of devices and a column may represent a substrate. In other words, the matrix described above may be transposed.

Generally, the methods described above are used for at least two classes, and at least two devices in at least two classes because this makes matrix overdetermined. Theoretically, at least one class may have only one device, and this would still be useful for determining the effect of the plurality of devices. At least one class may comprise more than two different devices, as shown in the examples described above in relation to equations (7) and (8). Theoretically, there may only be one class of devices and multiple devices within that class. In this case, it would still be useful, e.g. to obtain an average fingerprint based on these services. Alternatively, although the description refers to a first class and a second class, there may be more than two different classes. The classes may include the types of classes described above, a combination of at least one of the described classes with at least one additional class, or different classes may be provided. There may be different numbers of classes and different numbers of devices in each class.

In an example, a system is provided comprising a processor configured to determine a contribution from a device out of a plurality of devices to a fingerprint of a parameter, the parameter being associated with processing of a substrate. The processor is configured to carry out the method according to any one of the examples above. The processor may be part of, or connected to, either the automated process control (APC) system and/or the supervisory control system.

The processor may be configured to determine a contribution from a device out of a plurality of devices to a fingerprint of a parameter, the parameter being associated with processing of a substrate, the processor being configured to: obtain parameter data and usage data, wherein the parameter data is based on measurements for multiple substrates having been processed by the plurality of devices, and the usage data indicates the devices used in the processing of each substrate; and determine the contribution using the usage data and the parameter data.

In an example, a computer program is provided containing one or more sequences of machine-readable instructions describing methods of determining a contribution from a device out of a plurality of devices to a fingerprint of a parameter, the parameter being associated with processing of a substrate. Any of the above methods may be implemented using a computer program containing one or more sequences of machine-readable instructions. There may also be provided a data storage medium (e.g., semiconductor memory, magnetic or optical disk) having such a computer program stored therein.

A program is provided for controlling determining a contribution from a device out of a plurality of devices to a fingerprint of a parameter, the parameter being associated with processing of a substrate. The program may comprise instructions for carrying out the steps of: obtaining parameter data and usage data, wherein the parameter data is based on measurements for multiple substrates having been processed by the plurality of devices, and the usage data indicates which of the devices out of the plurality of devices were used in the processing of each substrate; and determining the contribution using the usage data and the parameter data. The program may comprise instructions for carrying out the steps of any of the methods described above.

The computer program may be executed for example within the control unit LACU of FIG. 1, or some other controller, for example within a metrology system that includes the metrology apparatus 140, or in an advanced process control system or separate advisory tool. The program may optionally be stored in a memory which is part of or can be accessed by the automated process control (APC) system and/or the supervisory control system.

The above described a method is for determining a contribution of a device to a fingerprint of a parameter. This allows the contribution from a single device out of a plurality of devices to be determined. This can be particularly useful for diagnosing performance of the devices used for processing a substrate and/or for controlling the devices used for processing a substrate.

This method allow the provision of a lithographic apparatus and methods of operating a lithographic apparatus in which a contribution of a device to a fingerprint of a parameter is determined.

The steps of determining a contribution of a device to a fingerprint of a parameter can be performed in any suitable processing apparatus, which may located anywhere in the facility of FIG. 1, or may be physically remote from the facility. Steps of the method may be carried out in separate parts of the apparatus.

The contribution, parameter data and/or usage data may be calculated in the supervisory control system of FIG. 1, or in the litho tool control unit LACU. They may be calculated in a remote system and communicated to the facility afterwards. Any model and measurement data may be delivered separately to a processing apparatus which then combines them as part of determining the contribution.

The method and variations above are described as being carried out using a lithographic apparatus. However, other apparatus may be used. The processing step of a lithographic manufacturing process is only one example where the principles of the present disclosure may be applied. Other parts of the lithographic process, and other types of manufacturing process, may also benefit from the generation of modified estimates and corrections in the manner disclosed herein.

Method for Maintaining Fingerprints

The following examples describe how fingerprint information can be maintained. It is described in further details below how this can be used in an embodiment of the present invention.

An example of the method gives the ability to characterize the full stack of layers through the lifecycle of an integrated circuit, by using a lithographic apparatus with its built in sensors to capture fingerprints through the stack of layers. This characterization is correlated to the process steps in between exposures defining each layer. The analysis of fingerprints through the stack of layers provides the capability to correct for the phenomena in the multi-layer process which are complex and time varying. For example, new equipment and new process recipes are constantly generating new fingerprints.

The lithographic apparatus has many in-line sensors in addition to alignment sensors. These include leveling sensors, sensors for aligning the reticle to the wafer stage chuck (e.g. "transmission image sensors" or "parallel integrated lens interferometer" type sensors) and sensors related to actuator stability. The lithographic apparatus' sensors are examples of sensors that can measure values of parameters spatially distributed across substrates. As well as a fingerprint representing the spatial distribution across the substrate, a fingerprint may represent a distribution of a process parameter across different wafers of a wafer lot. For example a fingerprint obtained from "parallel integrated lens interferometer" sensors could represent a reticle heating signature across the wafer lot. Examples utilize these sensors to characterize many or all individual processes (for example etch, deposition, develop track). This is possible as the scanner is involved at least once during fabrication of a layer on a wafer. The scanner can apply its sensors to all wafers passing through the lithographic process at least once per layer.

The scanner sensors used to determine a fingerprint may be dynamic. For example, for one layer the alignment sensor may be found to be most useful to determine a fingerprint representative for a process step, while for another layer a levelling sensor may be more informative. The use of sensors and the combination of sensor signals that yields most representative results (e.g. most informative for process control and processing apparatus optimization) may be subject to change and machine learning approaches may be used to converge to a per-layer optimal sensor signal constellation (e.g. layer 1: alignment color 1, layer 2: alignment color 2+leveling, . . . etc.)

As mentioned above, the wafers are processed through the stack of layers, the lithographic apparatus can capture the fingerprints at all the different steps. Fingerprint patterns can be related to each other by performing a through-stack analysis and fingerprints common across layers can be related back to events and phenomena occurring at each layer. This makes possible to properly optimize the processing apparatuses for subsequent process steps. These subsequent process steps performed by the optimized apparatus may be applied to the wafers from which the fingerprints were obtained. In that case, the corrections are applied during the processing of a wafer through its stack of layers, as a kind of real-time correction. This is an example of optimizing an apparatus for processing product units from which the object data was measured, at subsequent stages in the multi-stage processing. The subsequent process steps performed by the optimized apparatus may apply to steps throughout the processing of other wafers, including wafers processed in future. The optimized apparatus may be used to perform process steps at earlier as well as later stages in the process flow than the stage at which the analysis and optimization is performed. The optimization can involve fixing an identified process apparatus and/or process recipe. It can also involve using dedicated scanner corrections via alignment or overlay corrections.

Examples provide dynamically refined (adaptive) computation of current relevant fingerprints in incoming measurement data, without hard assignment of fingerprints to process control threads. The fingerprints may be determined for various key performance indicators (e.g. available scanner data) and yield. Uncertainties are made explicit, and all data may be used for improved estimations of all fingerprints (not necessarily with a "hard" split per thread), while the factorial model leaves inference mechanism tractable.

Examples provide optimal initialization and in-line decomposition by combining fingerprints from domain knowledge and by decomposition of new incoming measurement data into the active fingerprint library.

After decomposition of the received measurement data, the underlying main fingerprints can be identified. Based on the decomposition actions can be identified for improvement.

Examples provide on-the-fly linking to context and yield impact assessment. Fingerprints may be linked to incoming context history in the fab, and used for real-time yield (electrical probing, voltage contrast, CD-SEM) impact assessment. Yield assessment may be performed during the IC manufacturing process, which is much earlier than when actual yield data available.

Examples provide a way to find and track the contributing factors, called active fingerprints (AFPs), to the wafer measurements in real-time. Wafer measurements include, but are not limited to, alignment, leveling, overlay and CD. In order to achieve this, examples incorporate the prior knowledge (i.e. domain expertise and mining of existing data) about common fingerprints, called reference fingerprints (RFPs), as well as real-time data analysis in order to find the main contributing factors in the wafer measurements. In other words, it finds the contributing factors by decomposing the wafer measurements to the current instantiation (AFPs) of the known fingerprints (RFPs). Furthermore, examples have a mechanism to track systematic changes and drifts (evolution) in the AFPs and find new fingerprints when the current set of AFPs is not enough for explaining the measurements. In addition, a validator may be integrated in the model that examines the newly found AFPs against statistical evidence coming from measurement to validate if the found AFP is systematic and not due to noise. Examples enable dynamic wafer control by exploiting the model for metrology estimation.

Hence we are able to monitor the contribution of different factors in the measurements as well as keeping track of the fingerprints they put on the wafer. This results in a more natural fab process model that enables adaptive and dynamic control mechanism for per-wafer optimal control estimation and on-product performance impact analysis. In addition, this method can facilitate the root-cause and performance impact analysis as the factors can be traced through-stack and linked to process steps.

Figure 3:
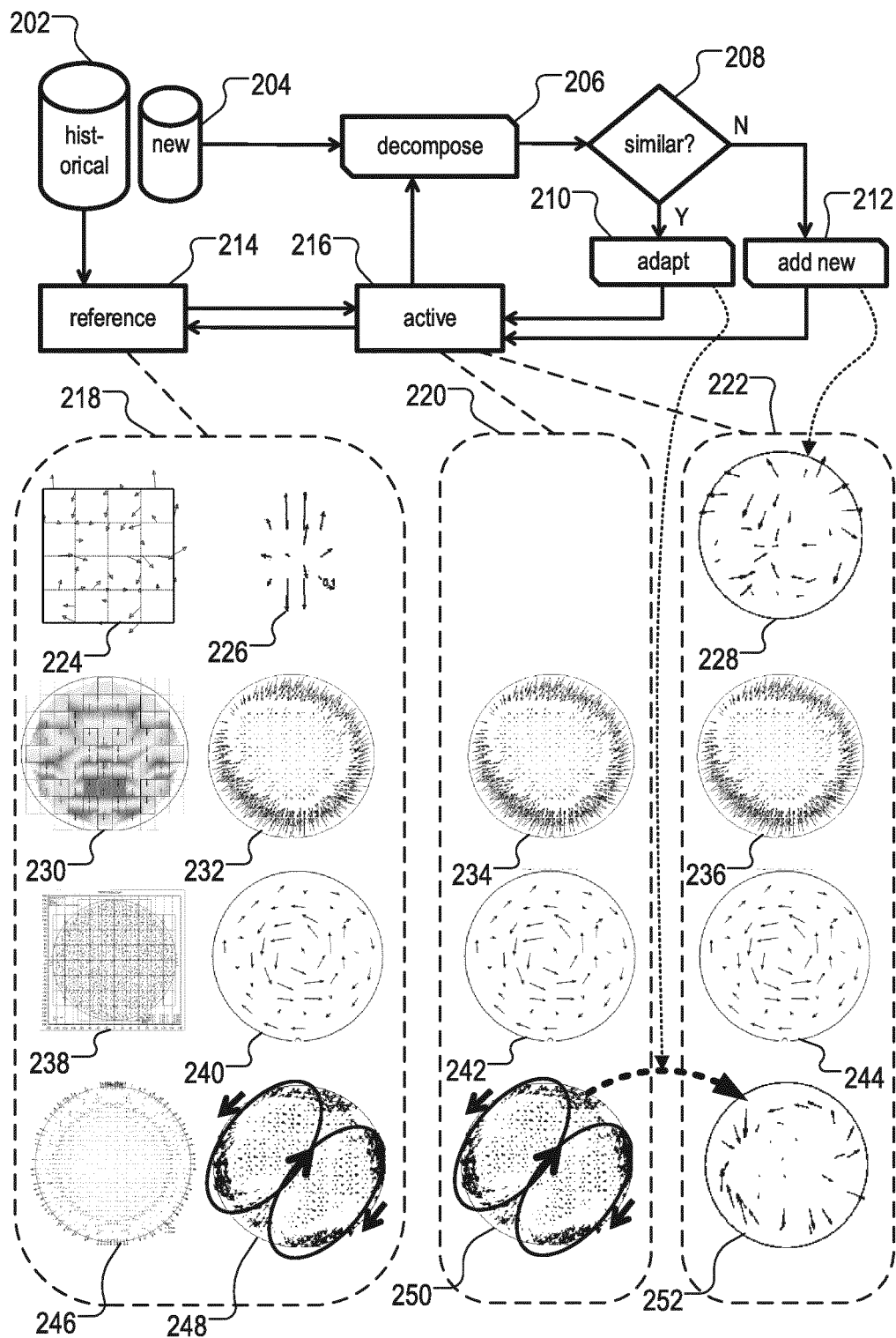
FIG. 3 is a flowchart of a method illustrating the reference fingerprint library and active fingerprint library.

FIG. 3 is a flowchart of a method according to an example illustrating the reference fingerprint library and active fingerprint library.

With reference to FIG. 3, the active fingerprint library 216 is a set of fingerprints representing variation of one or more process parameters across one or more product units, such as wafers. New measurement data 204 of one or more parameters measured on one or more product unit is received. The active fingerprint library 216 is first updated based on an expected evolution of the set of fingerprints, which may be based on an expected evolution of one or more process parameters. Evolution herein means a gradual development. Further updating of the updated set of fingerprints is based on decomposition 206 of the received measurement data 204 in terms of the first updated set of fingerprints. If the decomposed fingerprints are similar 208 to the first updated fingerprints, then the active fingerprint library 216 may be updated by adapting 210 a fingerprint. If the fingerprints are not similar 208, then the active fingerprint library 216 may be updated by adding 212 a new fingerprint to the active library. Fingerprints may also be removed from the active library.

Fingerprints may be added to the active library 216 by retrieving a fingerprint from a set of reference fingerprints in a reference fingerprint library 214. This can involve warping the retrieved fingerprint to determine the added fingerprint. The set of reference fingerprints in the reference fingerprint library 214 are derived from historical measurement data 202 representing one or more parameters measured on wafers.

The reference fingerprint library 214 may be updated itself with an updated fingerprint from the active library 216.

Examples 218 of fingerprints in the reference fingerprint library 214 are shown. The fingerprints are examples of writing errors 224, reticle heating 226, SUSD 230 (scan up/scan down effect, which is a measure of the shift of the fields exposed in the "up" scan direction with respect to the fields exposed in the "down" scan direction), etch 232, scanner chuck 238, CMP (chemical mechanical polish) 240, "ripple" 246 and anneal "dual swirl" 248.

The initial fingerprints 220 of the active library 216 are shown. Fingerprints 234, 242 and 250 are copies of the reference fingerprints 232, 240 and 248 respectively. Fingerprints 222 at a later time in the active library 216 are also shown. Fingerprint 228 is an example of a new fingerprint added at step 212. Fingerprint 252 is an example of an adapted fingerprint from step 210. Fingerprints 236 and 244 are both still present, although their stored likelihoods of occurrence (not shown) may be different from one instance 220 to the other 222.

Figure 4:
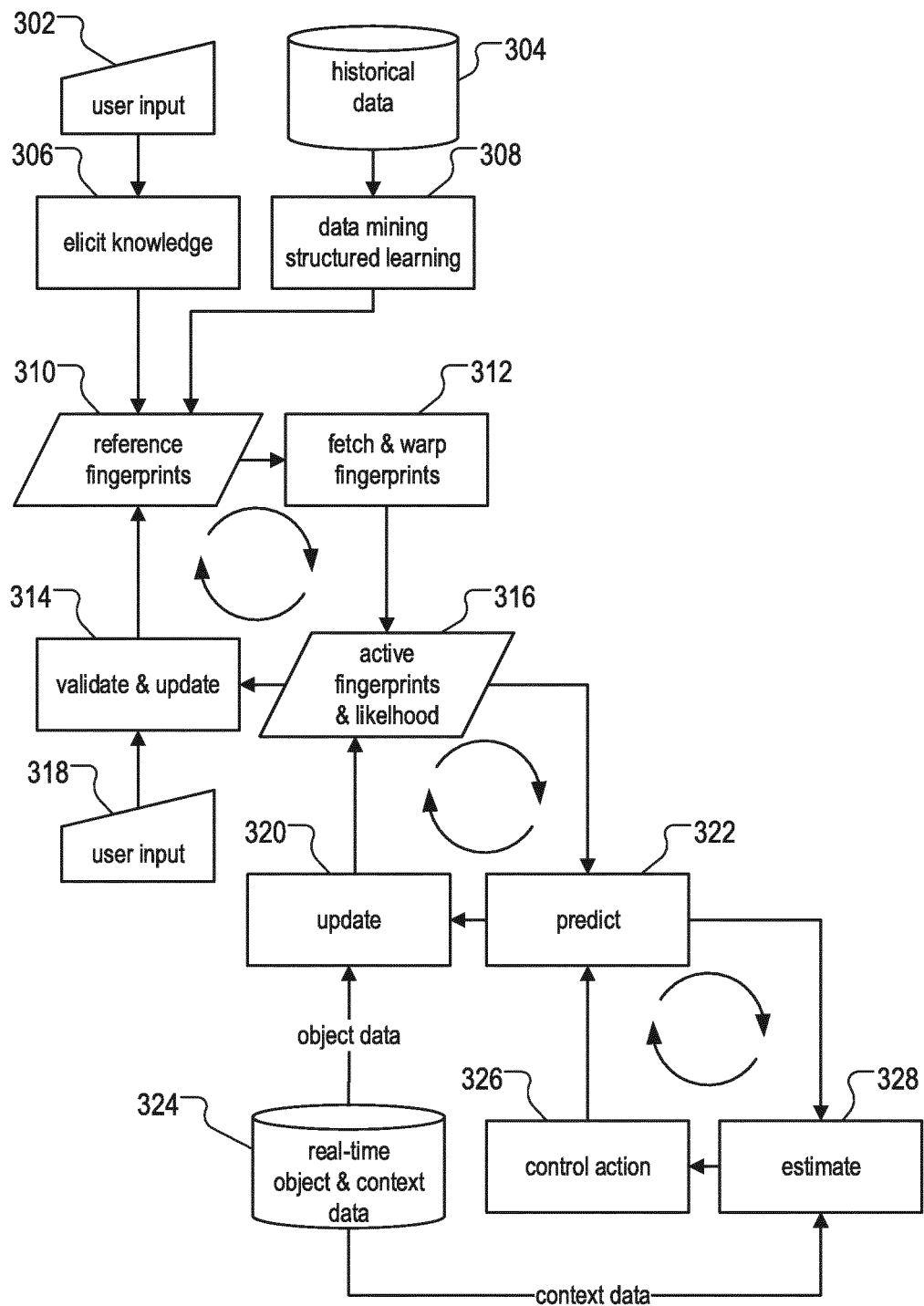
FIG. 4 is a flowchart of a method.

FIG. 4 is a flowchart of a method according to an example. It illustrates a method of maintaining a set of fingerprints in an active fingerprint library 316. The fingerprints represent variation of one or more process parameters across product units. In this example, the product units are wafer substrates. The method includes the steps: (a) receiving measurement data 324 of one or more parameters measured on wafers; (b) determining 320 a first updated set of fingerprints in the active fingerprint library 316 based on an expected evolution 322 of the set of fingerprints; and (c) determining 320 a second updated set of fingerprints based on decomposition of the received measurement data in terms of the first updated set of fingerprints. Each fingerprint may have a stored likelihood of occurrence, and the decomposition may involve: estimating, based the received measurement data, likelihoods of occurrence of the set of fingerprints in the received measurement data; and updating the stored likelihoods of occurrence based on the estimated likelihoods.

The decomposition may comprises using a factorial model wherein the estimated likelihoods of occurrence comprise coefficients of the factorial model.

Context data 324 represents records of one or more process parameters of the wafer(s) on which the measurement data was measured. The updating 320 of the active fingerprint library 316 may then be based on the context data 324.

The step 320 of updating the active fingerprint library may comprise calculating 328 expected measurement data. The calculation is based on predicted 322 fingerprints, which themselves may be based on the expected evolution of the set of fingerprints. The expected evolution of the set of fingerprints may be based on a model predicting the evolution of the set of fingerprints based on knowledge associated with an observed evolution of one or more process parameters. The calculation is also based on the received context data. A process control action 326 is then determined based on the calculated expected measurement data. The fingerprints in the active fingerprint library 316 may then be updated based on the determined process control action 326.

Updating 320 the set of fingerprints in the active library 316 may comprise adapting a fingerprint, adding a new fingerprint to the set and removing a fingerprint from the set.

Fingerprints may be added to the active fingerprint library 316 by retrieving (fetching) 312 a fingerprint from a set of reference fingerprints in a reference fingerprint library 310. This may involve warping 312 the retrieved fingerprint to determine the added fingerprint.

The set of reference fingerprints in the reference fingerprint library 310 are derived 308 from historical measurement data 304 representing one or more parameters measured on wafers.

The reference fingerprint library 310 can be updated 314 with an updated fingerprint from the active fingerprint library 316. User input 318 may be used to validate 314 the update.

These steps are described in more detail below.

Initial Setup 302-308: During initial setup reference fingerprints may be identified using three procedures:

Knowledge elicitation 306: Domain experts are consulted 302 for identification of fingerprints tool/process fingerprints they recognize. The fingerprints' shapes and variations are then encoded in the parametric or non-parametric form and put in the reference fingerprint library 310.

Data mining 308: Historical measurement data 304 is analyzed 308 by means of different exploratory data analysis techniques, e.g. cluster analysis, component analysis, to identify fingerprints. The fingerprints shapes and variations are then encoded in the parametric or non-parametric form and put in the reference fingerprint library.

Dynamic identification 314: Factors recognized by the adaptation procedure during wafer measurement decomposition are described below.

Reference Library 310-312: Consists of a repository of generic and heterogeneous fingerprints and some functionality to instantiate the fingerprints on a desired layout.

Reference Fingerprints 310: Container where generic fingerprints objects, called reference fingerprints, known from historical observations or physical definition, are stored. The fingerprints may be encoded in different parametric and non-parametric ways. The information of each fingerprint may contain its average shape, the shape variation and meta-data information about its history, root-causes, etc.

Fetch & Warp 312: The process of instantiating a generic reference fingerprint on the desired layout. This may generate a form of probability distribution that represents the shape of the fingerprint and its variation. This may be done by statistical function regression techniques (such as Gaussian Process, linear regression etc.) and/or by sampling techniques (Monte-Carlo sampling) and/or by parametric function evaluation. Warping means: not only layout-adaptations but also shape adaptations can be applied to instantiate the generic reference fingerprint. E.g. affine transformations of a basic shape (translating, rotating, scaling the shape) may be considered 'admissible variants' of the same shape. Warping may be implemented explicitly (e.g. by executing the transformation when instantiating), or implicitly (e.g. by using a rotation-invariant similarity metric or kernel when projecting new data to the fingerprint basis).

Active Library 314-322: Includes storage and functionality required to maintain and track changes of the state of fingerprints contribution the wafer measurements:

Active Fingerprints 316: Container where the current state of fingerprints are stored as some form of probability distribution that represents the shape of the fingerprint and its variation. Furthermore, information regarding the dynamics and statistics of each fingerprint may be stored alongside, such as a likelihood of occurrence. Initially the active fingerprints are fetched from the reference fingerprint library.

Predict 322: Predicts the state of the active fingerprints based on the fingerprints dynamic (evolution) models, process timing information and control actions for the upcoming wafer measurement. A combination probabilistic inference techniques may be used here (Variant of Bayesian recursive filtering, e.g. Kalman filtering, Particle filtering)

Update 320: Uses the predicted fingerprints and wafer measurement to:

A) Decompose the incoming wafer measurement in terms of the active fingerprints. Different component analysis methods can be employed based on the required regularization and constraints (e.g. sparse coding, dictionary learning, lasso/ridge regression, etc.). In addition, context sensitive wafer clustering may be used in decomposition to exploit clustering structure in the decomposition coefficients.

The basis on which the data is being decomposed can be either orthogonal or overcomplete. Hence, we enable heterogeneity in the reference library and still have an active library on which incoming data can be decomposed. Usually the measurements or the model parameter of several wafers, lots, fields, etc. can be organized on a tabular form. The columns represent different features (e.g. marks, parameters), while rows represent different instances (e.g. fields, wafers, lots). This rectangular/square representation can be seen as a algebraic matrix (real or complex) and accepts several kinds of decompositions. Those decompositions can be thought as different ways the basic elements of the matrices are presented. For example principal component decomposition, shows the fingerprints that the data have the maximum variance which is an excellent way to obtain fingerprints from statistical point of view where variance is a key factor. Other suitable decompositions may reveal more addition physical information. For the purposes of these examples it is suggested to utilize the power of other additional matrix decompositions offered from numerical linear algebra. The list below is incomplete but gives an idea of the alternative algorithms of decomposition:

i) General:
Sparse dictionary
Rank Factorization (A=CF)
Interpolative decomposition
Jordan
Schur
QZ
Takagi
Polar
ii) Orthogonal:
QR decomposition
LQ
SVD (singular value decomposition)
iii) Spectral:
Eigendecomposition
iv) Non-negative:
Factorization to matrices that have non-negative values B) Calculate the corrections for updating the active fingerprints. Depending on the representation of active fingerprint different methods can be employed here such as updating of sufficient statistics, MAP (maximum a posteriori probability) estimate, ML (maximum likelihood) estimate.

C) Identify new fingerprints when the set of active fingerprints are not enough to explain wafer measurement. A combination of change/novelty/abnormality detection methods and/or nonparametric latent component models (e.g. Dirichlet Process and Indian Buffet Process) may be used here.

Validate 314: Statistically evaluates the dynamically identified fingerprints to check if they are systematic or due to noise. When a fingerprint is confirmed, a user can decide 318 to put it to the reference library. Sequential log-likelihood ratio test is a possible implementation for this block.

Estimate 328: Calculates the expected measurement (in terms of the wafer measurement) using the predicted active fingerprints as well as contextual information 324 by means of predictive models. A combination of statistical inference and/or predictive models may be used for this purpose.

Control action 326: Finds optimal process control action based on the calculated expected measurement.

The method's process flow contains three intertwined loops: identification, updating and control. The identification loop (shown within 310, 312, 316, 314) is asynchronous governed by the rate of insertion of dynamically identified fingerprints in the reference library. On the other hand, the updating (within 316, 322, 320) and control loop (within 322, 328, 326) cycles are synchronized to the rate of receiving wafer measurements (per wafer).

Figure 5:
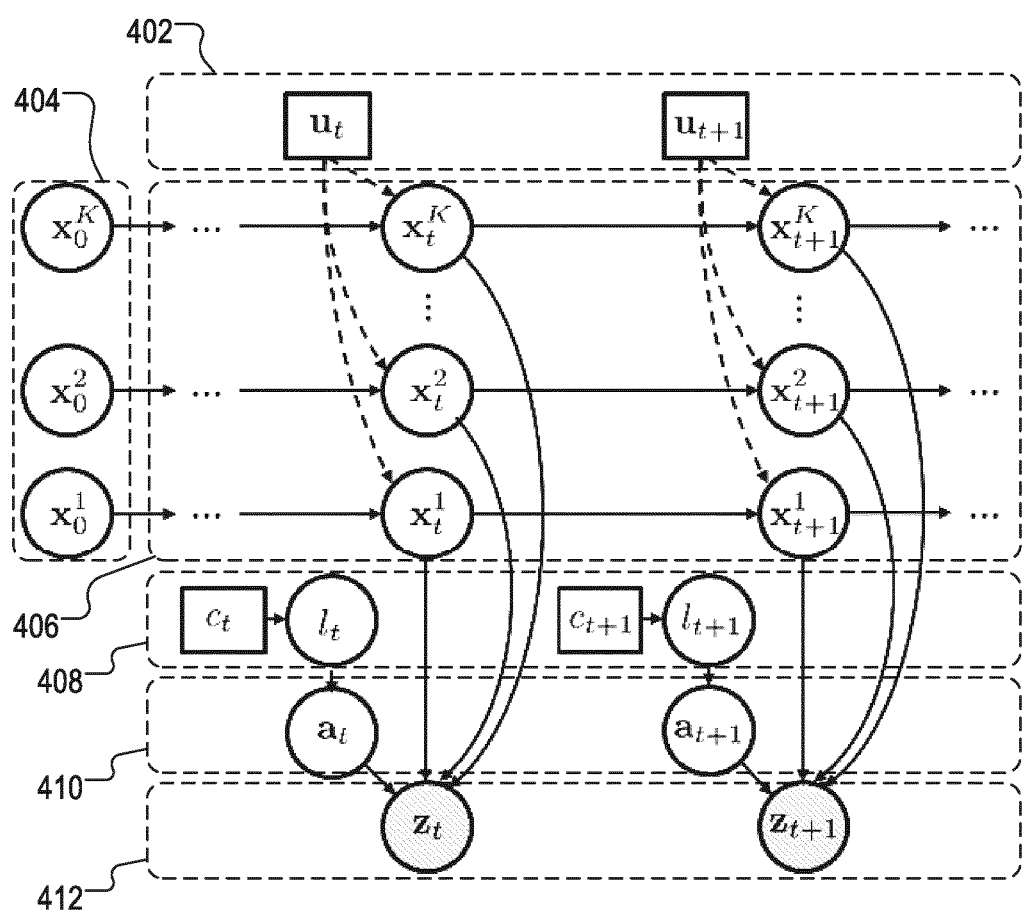
FIG. 5 illustrates the dynamic model of the active fingerprint library.

FIG. 5 illustrates the dynamic model of the active fingerprint library. $x_t^j$ is the state of the active fingerprint at the time of observation t-th wafer measurement $z_t$ 412. $u_t$ is the control action 402 and $c_t$ is the context information used in context sensitive clustering 408. $a_t$ is the decomposition coefficient 410.

Based on the model in FIG. 5 the function of the blocks in FIG. 4 can be defined as follows:

Fetch & warp 312: generate initial active fingerprints $x_0^1$ to $x_0^K$ 404.

Predict 322: estimate dynamic AFPs 406 $x_{t+1}^j$ from $x_t^j$ and $u_t$.

Estimator 328: estimate $z_t$ from $c_t$, $x_t^1$ to $x_t^K$

Update 320:
estimate $x_{t+1}^j$ from $x_t^j$, $u_t$ and $z_t$
add $x_{t+1}^{K+1}$ if necessary.

Advantages of these examples include:

A) In-line estimation of contributing factors (fingerprints) in wafer measurements, enabling early yield impact assessment when initial layers from a new product or node are being exposed in ramp-up phase. Enabling faster root cause analysis and process optimization, and potentially faster ramp and time-to-market.

B) Adaptive dynamic model (robust to e.g. process or tool usage changes in the fab).

C) Enables 'soft-assignment'-based wafer level control (circumvents possible prior art mentioning hard grouping or classification mechanisms).

D) Facilitates root-cause and on-product performance impact analysis.

E) In-line process monitoring and easy visualization of fingerprint and context contributions to a wafer.

Figure 6:
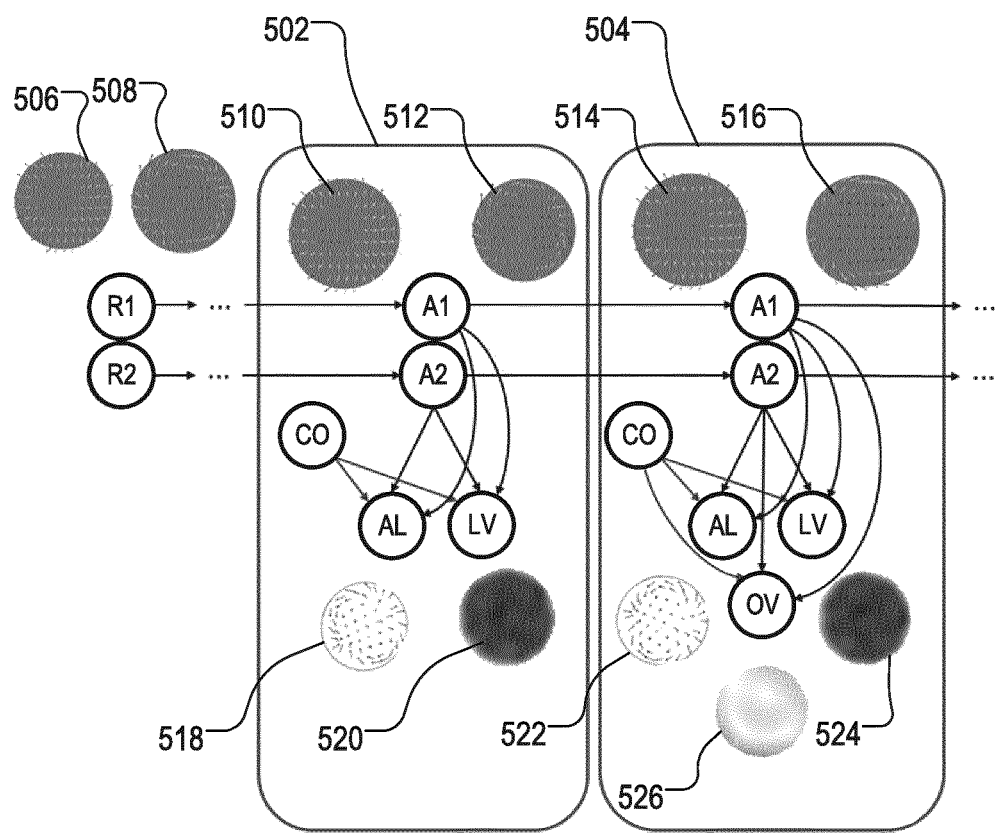
FIG. 6 illustrates a simplified example of the dynamic model of FIG. 4.

FIG. 6 illustrates a simplified example of the dynamic model of FIG. 5.

With reference to FIG. 6, two fingerprints 506 and 508 are in the reference fingerprint library (referred to as 'scaling' and 'dual swirl' fingerprints respectively). They are also shown as reference fingerprints R1 and R2. Their evolution in the active library at two time instances 502 and 504 are shown. The patterns 510 and 512 are shown at time 502 and the corresponding active fingerprints are also represented as A1 and A2. The patterns 514 and 516 are shown at time 504 and the corresponding active fingerprints are again represented as A1 and A2.

Measurements are leveling LV, alignment AL and overlay OV. Note that some measurements are not always available (e.g. OV) but when they are provided they may be utilized. Fingerprints in the library represent a common cause for the patterns seen in the wafer measurements and they manifest themselves in different type of measurements. The contribution of fingerprints A1 and A2 in the measurements AL, LV and OV depends on the context of processing CO and metrology. At time 502, the measurement result 518 of alignment measurement AL and the measurement result 520 of leveling measurement LV are shown. At time 504, the measurement result 522 of alignment measurement AL, the measurement result 524 of leveling measurement LV, and the measurement result 526 of overlay measurement OV are shown.

Horizontal arrows show evolution of fingerprints A1 and A2. Evolution herein may be temporal (for example when measurements are on single layer of different chronologically ordered wafers) or thru-stack (for example when measurement are on multiple chronologically ordered layers of one wafer). In the example of FIG. 6, it is apparent that the dual swirl fingerprint 508 slightly rotates between two time instances 502 and 504, as seen by comparing 512 and 516.

Any of the examples may be implemented using a computer program containing one or more sequences of machine-readable instructions describing methods of maintaining a set of fingerprints, as described above. This computer program may be executed within a computing apparatus, such as control unit LACU of FIG. 1, or some other controller. There may also be provided a data storage medium (e.g., semiconductor memory, magnetic or optical disk) having such a computer program stored therein.

Figure 7:
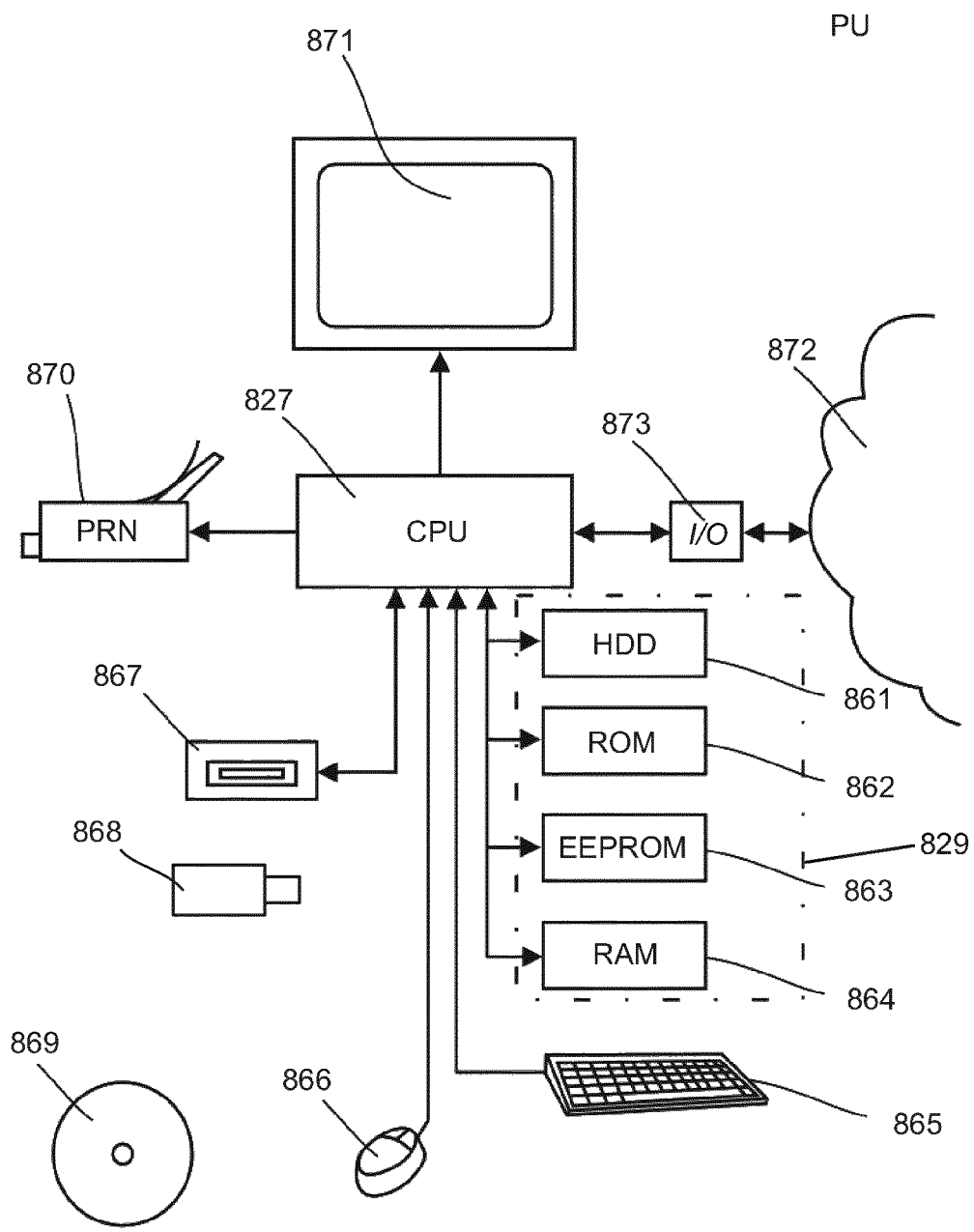
FIG. 7 illustrates computing apparatus hardware useful in implementing the methods described in relation to FIGS. 1 to 6.

This control unit LACU may include a computer assembly as shown in FIG. 7. The computer assembly may be a dedicated computer in the form of a control unit in examples of the assembly or, alternatively, be a central computer controlling the lithographic apparatus. The computer assembly may be arranged for loading a computer program product comprising computer executable code. This may enable the computer assembly, when the computer program product is downloaded, to control aforementioned uses of a lithographic apparatus with examples of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CDROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an example, external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computer system can be any signal processing system with analogue and/or digital and/or software technology arranged to perform the functions discussed here.

Method of determining a control scheme for a device configured to process and/or measure at least one substrate and/or determining which of multiple devices contributed to a fingerprint of a processing parameter of said substrate The following description describes embodiments of the present invention. Embodiments include a method, computer program and/or system for determining a control scheme for a device configured to process and/or measure at least one substrate and/or determining a contribution to a processing parameter of a device. The device used to process and/or measure at least one substrate may be at least one device used to process and/or measure at least one substrate. As described below, the exemplary methods described above can be used with, or as part of, embodiments of the invention. In other words, the embodiments may incorporate at least some of the features of the examples described above.

A variety of different processes are generally used to manufacture a substrate. A device may be used to carry out a specific process on the substrate. There are normally a number of different devices used to process a single substrate. A substrate may be processed by a particular thread, which is a number of devices used to process a substrate in different ways. Each one of the devices may impact a parameter of the substrate as described above. The device may otherwise be referred to as a tool or apparatus or equipment. The different types of device could include, but are not limited to, a patterning device MA, etching devices, deposition tools, substrate tables, polishing devices, such as chemical-mechanical planarization devices, annealing devices, such as rapid thermal annealing devices, cleaning devices, coating devices, such as those used to apply a resist, developing devices, track devices, implantation devices and/or baking devices.

When a substrate is manufactured, errors can be introduced. In some cases, if the error is greater than an acceptable magnitude, the processed substrate will not be usable. Errors can be introduced in a variety of different ways. The substrate may be processed by a number of devices, each of which impacts a parameter and causes errors on the substrate. Process parameters on the substrate can be measured to determine errors for a particular parameter. The devices used to process a substrate can be controlled based on measured parameters, to reduce the impact of that device. This may be beneficial in overall reduction of errors on processed substrates. This may improve the quality of the processed substrates and/or improve efficiency of processing batches of substrates (if there is a decrease in the number of unusable substrates). Thus, any improvement in the control of the processing devices can reduce parameter error and improve efficiency of substrate production.

Control loops, which are based on measured parameters, may be used to manufacture substrates. The measured parameters may include, but are not limited to overlay, critical dimensions, and/or focus related parameters. Two separate loops may be used for manufacturing a substrate. A first loop may be an automated process control (APC) loop for measuring a number of substrates within a batch (i.e. a number of substrates which are processed in the same way by the same devices). The measurements can then be used to control processing of a next batch of substrates. In this way, control of the processing of a batch of substrates can be improved. A second loop may be used to measure drift contribution from a device. The second loop may be referred to as a baseliner control loop.

The drift is the variation of the impact of a device on substrates over time. The drift contribution from a device may be measured, for example, by using reference substrates. The baseliner control loop may be used to monitor drift of a particular device over a certain period of time, for example over several days. If the drift is accurately monitored, the device can be restored to a particular state to take account of the drift.

Accurately monitoring the drift includes taking measurements of the substrate processed by at least the relevant device. Measurements can be used to monitor the ongoing impact of the device on the substrate (and any errors on the substrate). Although taking measurements of relevant parameters and using control loops to manufacture substrates can account for some tool drift, there is still room for improvement. The presently adopted control process is not as efficient as it could be. Although accurate and informative measurements are useful for controlling the devices used to process a substrate, taking measurements can also be disruptive and time consuming. Often too many measurements need to be made in order to compensate for a lack of knowledge. This limits throughput of the substrates being processed and potentially introduces unnecessary noise components.

It would be advantageous to improve control of these devices by improving the way that the control loops are carried out. This can be done by improving the way in which the system takes measurements of the parameters. As will be described below, embodiments of the present invention can be used to improve and/or optimize the sampling of substrates spatially and temporally, to improve and/or optimize the control of at least one device used to process a substrate and/or to determine which of multiple devices has contributed to a fingerprint of a processing parameter of a substrate. The present invention provides a method (and a corresponding computer program, computer product and system) of determining a sampling control scheme, of determining a processing control scheme, and/or of determining at least one device which has contributed to the processing parameter.

Temporal evolution of a parameter, e.g. overlay, may be used to value process control parameters. For example, temporal evolution of overlay may be used for determining parameters controlling Moving Weighted Average (MWA) algorithms used in Advanced Process Control (APC). Model parameters can be determined from finding the best model (e.g. with minimum residual, typically referred to as 'normalized model uncertainty'=nMU) and a suitable layout for that model (minimum nMU). For example, from the overlay fingerprint of a layer, a model can be chosen. Then, a certain layout having minimum nMU with respect to that model is chosen. Given the model and the layout, the 'model parameters' can be calculated of the overlay data. However, it is not clear how complex measurements need to be to capture relevant fingerprints. In other words, it is not clear whether a chosen sampling control scheme will capture relevant fingerprints, wherein relevant fingerprints are fingerprints which might dominate a certain process condition or fluctuation of process conditions, for example due to drifts occurring in devices used in processing the substrates. For users, this means that there is uncertainty as to how distribute the measurements across the substrates and use the limited measurement time budget in the best way to be able to measure the most dominant contributions. Basically it is of great importance to measure overlay at the right spatial resolution and temporal frequency. Thus, given an idea about a fingerprint and/or a change of a fingerprint over time, it is advantageous to determine an improved temporal frequency of a sampling control strategy, for example, to determine if measurements would be optimized if carried out per substrate or per batch of substrates or per context.

The methods described can improve the way measurements of a parameter are taken, in other words to provide an improved sampling control scheme to determine how measurements are to be taken. In turn, this can improve the overall method of processing substrates. The methods described can improve the way processing of a substrate is controlled, in other words to provide an improved processing control scheme to determine how a device used to process a substrate is to be controlled. In turn, this can improve the overall method of processing substrates. The methods described can be used to determine which of multiple devices has contributed to a fingerprint of a processing parameter, for example to determine a specific device which is contributing to the overlay error in a layer of the substrate. In turn, this can improve the overall method of processing substrates.

Figure 8:
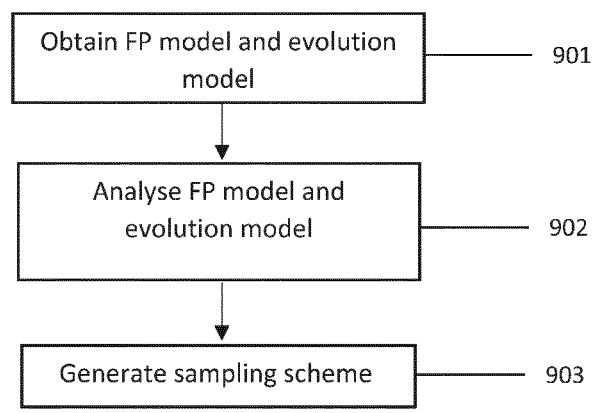
FIG. 8 illustrates a method of determining a sampling scheme in accordance with an embodiment of the invention.

In a first embodiment, the present invention provides a method of determining a sampling scheme for substrates to be processed by a device. The sampling scheme referred to is an example of a control scheme and can otherwise be referred to as a sampling control scheme. The terms sampling control scheme and sampling scheme can be used interchangeably. This method is shown in FIG. 8 which is a flowchart illustrating how the sampling scheme is determined. The method comprises a step of obtaining a fingerprint model and an evolution model (901), a step of analyzing the fingerprint model and the evolution model (902), and a step of generating a sampling scheme for the device using the analysis (903). As described below, the method may use one or more fingerprint models and one or more evolution models. The sampling scheme provides an indication for where and when to take measurements on substrates processed by the device.

The fingerprint model is based on fingerprint data for a processing parameter of at least one substrate processed by a device. The fingerprint model shows information relating to a specific processing parameter across an area of the substrate. The evolution model represents variation of the fingerprint data or fingerprint model over time. Thus, the evolution model represents a change in a process parameter over time. For example, the evolution model may be determined based on measurements taken on a particular layer of a particular substrate at different times during processing. This may show how the processing of the substrate affects the fingerprint over time. Alternatively, as described below, the evolution model may be determined based on measurements taken on a corresponding layer of multiple substrates (e.g. on the first layer of several substrates). This may show how drift of a process may occur over time, preferably within one batch. Alternatively, as described below, the evolution model may be determined based on measurements taken on multiple layers of at least one substrate. This may show the different impact of the process on the fingerprint from layer to layer. The evolution model in any of these variations may be based on measured data, or stored data relating to a specific parameter and/or process, etc.

The sampling scheme beneficially provides an indication for when and where to take measurements, i.e. provides a spatial indication of where measurements should be taken and a temporal indication of when measurements should be taken. In other words, the sampling scheme indicates when and where to take samples of a substrate. The measurements/samples relate to processing parameters on the substrate which provide an indication of any errors on the substrate.

The processing parameter may be any parameter affected or controlled during processing of a substrate. For example, the processing parameter may be selected from a group comprising critical dimension, overlay, critical dimension uniformity, side-wall angle, line edge placement, alignment, focus, which may otherwise be referred to as levelling, pattern shift, line edge roughness, micro topology, and/or edge placement error (EPE). Thus, for example only, if the processing parameter is related to alignment, the fingerprint model may be a characteristic of measurements taken by at least one adjustment measurement tool and/or if the processing parameter relates to levelling, the fingerprint model may be a characteristic of measurements taken from at least one level measurement tool. Additionally or alternatively, the processing parameter may be selected from a group comprising a shape description of a feature such as side-wall angle, resist height, and/or contact hole ellipticity. Additionally or alternatively, the processing parameter may be selected from a group comprising a coating thickness, optionally bottom anti-reflective coating thickness and/or resist thickness. Additionally or alternatively, the processing parameter may be selected from a group comprising an optical property of a coating, which may optionally indicate a measure of absorption, such as refractive index and or extinction coefficient. Additionally or alternatively, the processing parameter may be selected from a group comprising a parameter determined from substrate measurements, such as yield parameters, optionally defects and/or electrical performance. The method may be applied to any one of these parameters and could be used on multiple parameters depending on which of the parameters are of most interest or importance to a particular user.

Sensors may be used to measure the parameters on the substrate. The sampling scheme can be used to optimize the frequency and spatial distribution at which measurements of parameters are taken. The sampling scheme may be used to determine when measurements should be taken on multiple substrates. The sampling scheme can be used to determine where and when to measure substrates which have already been processed by the device. Additionally or alternatively, the sampling scheme can be used to determine where and when to measure substrates which have not yet been processed by the device.

The method helps determine how to distribute sampling in time and space according to fingerprint information and evolution. The method of the present embodiment is beneficial in that an improved sampling scheme is generated. This sampling scheme can be used in a variety of different ways. The sampling scheme can be used to decrease the amount of unnecessary measurements that are taken. Additionally, the sampling scheme can be used to take measurements which are more beneficial in controlling the processing of substrates.

Known processes are not as efficient as they could be because sampling is not carried out in time and space according to fingerprint data as in the present embodiment. By using a fingerprint model as well as an evolution model, it means that expected variation of a fingerprint over time can be used to determine the sampling scheme. As described in further detail below, evolution of a fingerprint can be associated with known behavior contributors (e.g. from a particular device) to a fingerprint model of interest which means that processing using that device can be more accurately and efficiently controlled.

Variation of the fingerprint data occurs over time for a variety of different reasons. The evolution model is an indication of how the fingerprint data varies. For example, this means that the evolution model can track the variation of the impact of a device on a substrate as the device drifts over time. Thus, generating the sampling scheme based on a combination of the fingerprint model and the evolution model allows the generated sampling scheme to take useful information into account when determining where and when substrates should be measured.

Using the evolution model is particularly advantageous, because if the evolution model is relatively stable, then measurements can be taken less frequently. This reduces the amount of unnecessary measurements taken. If the evolution model is relatively unstable, then measurements can be taken more frequently. This increases the likelihood that changes to a parameter due to a particular device are accounted for. Overall, this means that the accuracy of the device can be controlled or improved in an efficient manner.

The sampling scheme may be optimized in various different ways. For example, the sampling scheme can be optimized for fingerprints for a specific device. The sampling scheme may be optimized based on context information/data. For example, a first apparatus may be known to have a fingerprint model with a dual swirl pattern oriented along a first axis and a second apparatus may be known to have a fingerprint model with a dual swirl pattern rotated with respect to the fingerprint model of the first apparatus. In this example, a sampling scheme for the second apparatus can ideally be a rotated version of the sampling scheme for the first apparatus. Thus, context information, which might indicate which device/apparatus is used to process a substrate, may be used to select sampling scheme. The sampling scheme may be optimized based on a predetermined number of measurements per substrate. The predetermined number may be set according to user preferences. The sampling scheme may be optimized by only allowing a certain amount of change in the evolution model between measurements. The preferred mode of optimization can be used to generate a sampling scheme appropriate for a user.

Measurements of substrates processed by a device can be distributed spatially, i.e. across the substrate. Measurement of substrates processed by a device can be distributed in time, i.e. over a specific time period, such as one day or one week. The sampling scheme generated in the present embodiment determines when and where measurements should be made. The generated sampling scheme may therefore comprise a set of sampling locations, each set configured to be measured with a certain frequency. This means that a pattern of measurements is taken over a specified time period, e.g. measurements in a certain location of a substrate may be repeated after a predetermined lapse of time. The measurements may be taken in specific locations and at a set density during that time period.

Based on the present embodiment, in production, substrates may be processed and sampling of the substrates may be scheduled according to the expected characteristics of the device (or devices) used to process the substrates. For example, substrates A which has been processed by an etch chamber may be sampled based on a first sample scheme. The first sample scheme may predominantly include sampling points concentrated on the edge of the substrate on a weekly basis. The sampling points may be on the edge of the substrate as this location is known to have the most variation due to etching of the substrate. The time period of a week may be sufficiently frequent to keep track of variation of the impact of the etch chamber based on the evolution model of the relevant parameter for that etch chamber.

The same substrates A may be subject to a deposition step performed by a deposition tool. As an example, the contribution to the fingerprint from the deposition tool may be butterfly shaped with a time constant of 3 months. A second sampling scheme may be determined for substrates having been processed by the deposition tool. In such a case, the second sampling scheme may determine that monthly measurements of the substrates may be performed and may be configured to obtain measurements optimized to determine relevant characteristics associated with the expected butterfly shaped fingerprint.

The sampling scheme may otherwise be referred to as a plan or schedule. The sampling scheme may be generated and stored in a memory of a computer. The sampling scheme could be automatically implemented using a computer system as described below to carry out measurements. The sampling scheme may be equivalent to data specifying the location and time at which certain measurements should be made. The sampling scheme could be provided in a variety of different formats. The sampling scheme may be provided as a list. The sampling scheme may be provided in a spreadsheet. Preferably, the sampling scheme is provided in chronological order. In other words, the sampling scheme is arranged to indicate which measurements should be made at what time in the order in which measurements are to be carried out, from the next measurement to be made to the last measurement to be made.

The sampling scheme could be generated in a variety of different ways. In all of the examples, the sampling scheme may be based on analysis of a fingerprint model and an evolution model. Different analysis may be used depending on how the fingerprint model changes over time (which is indicated by the evolution model) and/or user preference. US2008109089 (incorporated herein by reference in its entirety), generally describes metrology and describes spatial density and measurement frequency for sampling. US2008109089 describes control based on characteristic measurement data. In particular, paragraph [0012] may provide useful insight on metrology methods.

The sampling scheme may be based on temporal gradient analysis of the evolution model. In other words, the analysis may determine the rate of change (i.e. slope of gradient of change plotted over area or time). If the rate of change (i.e. the temporal gradient) is low, the samples can be taken less frequently and/or densely, whereas if the rate of change is high, the samples can be taken more frequently and/or densely. Generally, where instability of the impact of the device on the substrate over time is higher, the temporal gradient of the evolution model will be higher. Thus, the evolution model can be analysed to determine the gradient of temporal changes in the evolution model, i.e. changes in the evolution model over time. As a further example, if a spatial gradient of change of a fingerprint model increases linearly with radius over the substrate, the sampling scheme may indicate that a spatial density of measurement points may be kept constant across the substrate.

The temporal gradient is an indication of the rate of change of the parameter over time. So the higher gradient indicates a high rate of change in a given time period. If there is a high rate of change, it may be beneficial to carry out sampling more often. The temporal gradient of the fingerprint model may also be high exclusively across certain areas of the substrate indicating that there is instability within the substrate. In other words, there may be a relatively large change in fingerprint data across a small area of the substrate which shows a high temporal gradient.

Alternatively, the fingerprint model can be analysed to determine the gradient of spatial changes in the fingerprint model. It may be beneficial to densely sample in areas with high spatial variation across a certain area/space. WO2017194289 (incorporated herein by reference in its entirety), discloses determining sampling schemes based on the spatial gradient. In particular, paragraphs [0072] and [0115]-[0117] may provide useful insight for generating a sampling scheme based on the spatial gradient.

The sampling scheme may be generated based on expected changes to the fingerprint model and/or evolution model. For example, analysis of the evolution model may be carried out and the evolution model may be extrapolated in space and/or time. This is advantageous because the evolution model does not have to be continuously updated. However, it may not be as accurate as using feedback to provide a more up to date fingerprint model and/or evolution model.

Generally, the sampling scheme may be based on time evolution of the fingerprint, which may be indicated by the evolution model. For example, measurement points may be distributed according to expected changes (for example, etch evolution model=exp(-t*r/a), hence sample more at edge as change over time is more pronounced there). Additionally, measurement points may be based on spatial model, probably in combination with time evolution, which may be indicated by the fingerprint model and the evolution model.

The fingerprint model and evolution model may be analysed to determine differences between the measurements taken and the fingerprint model and/or evolution model. The sampling scheme may be set to allow a predetermined amount of deviation from the fingerprint model. In other words, the sampling scheme may be generated based on a threshold of the difference between the measured values and the fingerprint model values. When the threshold is reached, or expected to be reached, the sampling scheme may indicate that further measurements should be taken and/or further action to reduce the difference. Generating a sampling scheme based on deviation measurement data from a fingerprint model is described in WO2017194289 (incorporated herein by reference in its entirety). In particular, paragraph [0071] may provide useful insight for generating a sampling scheme based on a threshold.

The evolution model may be analysed to determine variation between substrates. The sampling scheme may then be generated based on the determined variation between substrates, i.e. based on substrate to substrate variation. In this way, points which show variability which is too high can be removed. This removes outliers in the measurements to improve the quality of the measurements used to control the at least one device. This is described in WO2017194289 (incorporated herein by reference in its entirety). In particular, paragraphs [0100] and [0109] may provide useful insight for generating a sampling scheme based on variation between substrates.

The sampling scheme may be generated based on a distributed sampling technique. For example, the sampling scheme may be relatively sparse spatially. However, the location of sampling may be varied over time so that when the measurements taken over a given area over time are considered, the sampling is spatially dense for a given time period. This may be otherwise considered as a spatial model which is stacked over time to sample an area more densely. This type of sampling scheme is beneficial in that it decreases the overall number of measurements, and allows frequent measuring but with spatial variations or shifts in the sampling scheme. Generating a sampling scheme using such distributed sampling is described in US2014354969 (incorporated herein by reference in its entirety). In particular, paragraph [0343] and FIG. 16 may provide useful insight for generating a sampling scheme based on a distributed sampling.

The sampling scheme may be based on insufficient coverage of data and/or uncertainty of how the fingerprint will vary. For example, the analysis of the fingerprint data and/or evolution data may identify that there are areas of the substrate in which a number of measurements is below a predetermined threshold per area, or for a given area over time. For example, a parabolic fingerprint model may vary in the centre only indicating that measurement data is only needed in the centre of a substrate, however this may mean that there is no indication of what is happening at the edge. The sampling scheme may be based on carrying out measurements at points which may be most informative for the fingerprint model and/or evolution model. For example, if a fingerprint model is radially quadratic across a substrate, the sampling scheme may determine the optimal number of sample points such that acceptable modelling accuracy achieved. This sampling scheme may generated to only measure points that will improve the fingerprint model and/or evolution model, i.e. by obtaining data in areas where there is not enough information. For example, this may mean sampling in areas with very low density sampling, i.e. in areas where not much information is known.

Generating a sampling scheme based on insufficient coverage of data is described in US2008109089 (incorporated herein by reference in its entirety). In particular, paragraph [0035] may provide useful insight for generating a sampling scheme in this way. The sampling scheme may be optimized as described in US20160334717 (incorporated herein by reference in its entirety). In particular, paragraph [0088] may provide useful insight for generating a sampling scheme based on an uncertainty aspect, and paragraphs [0009] and [0049]-[0053] may provide useful insight for generating a sampling scheme based on informativity aspect.

The measurements taken across a substrate may be analysed. The analysis may determine the change in a fingerprint across the substrate and over time. The analysis may identify a region of change in which the fingerprint model changes more rapidly than in other areas. The sampling scheme may be determined to sample regions of the substrate with a higher rate of change more frequently than regions of the substrate with a lower rate of change. For example, if most change occurs in one half of the substrate, then the sampling scheme may be determined to carry out sampling in that half more often than the other half.

In this way, the substrate may be divided into various different areas and a sampling scheme may be generated for each of these different areas, instead of or as well as the whole area of the substrate. For example, the substrate may be divided into at least two areas. The substrate could be divided into two areas, wherein a first area is around the edge of the substrate and the second area is in the centre of the substrate (for example, based on etching contribution). The substrate could be divided into an X axis centred area and a Y-axis centred area, which may for example form a saddle shape (for example, based on contribution from deposition steps). The substrate could be divided into areas based on dual swirl patterns (for example, based on contribution from chemical-mechanical polishing (CMP) processing). Ideally, the areas do not overlap with one another.

The amount/number of sampling points which is considered to be less frequent and/or less dense will depend on the desired targets/amount of measurements needed or required by a user. Ideally, the sampling scheme keeps the number of measurements needed as low as possible whilst providing enough information to the user about the substrates, for example, to allow accurate control of devices used to process the substrates.

To provide an example of the determination of the sampling scheme only, the sampling scheme may determine that 2000 measurements are to be taken across an area of a substrate for a particular device, the sampling scheme may determine that 2 substrates per device should be measured every 3 days. Alternatively, only 200 measurements points may be sampled on a substrate, and in this case 2 substrates per device might be measured per batch. Thus, the sampling scheme may provide a balance to indicate the measurements needed on each sample, i.e. spatially, and when those samples need to be taken, e.g. per batch, per day or per week, etc.

The fingerprint data may relate to a single processing parameter, i.e. the fingerprint data may relate to only one processing parameter. Alternatively, the fingerprint data may relate to multiple processing parameters, i.e. various different processing parameters. The fingerprint data for a processing parameter of a substrate processed by the device is an indication of the contribution and impact of that device on the substrate.

The fingerprint model may comprise at least two fingerprint sub-models. The fingerprint sub-models may relate to the same parameter. Each fingerprint sub-model may be associated with a different spatial scale of variation across the substrate and/or a different temporal scale. The sampling scheme may be based on a fingerprint sub-model. This may be beneficial in providing a sampling scheme based on more specific data, which would allow the temporal and/or spatial variation in that fingerprint sub-model to be more effectively accounted for by the sampling scheme. Similarly, the evolution model may comprise at least two evolution sub-models. The evolution sub-models may relate to the same parameter. Each evolution sub-model may be associated with a corresponding fingerprint sub-model. The evolution sub-model may provide an indication as to when to take measurements on substrates processed by the device for the parameter variation in that sub-model.

Multiple fingerprint sub-models may be used for a single parameter. Multiple evolution sub-models may be used for a single parameter. Each fingerprint sub-model may have different spatial components, i.e. relating to different spatial scales (for example intra-field and inter-field), different parts of the substrate and different percentages of the area of the substrate. Each evolution sub-model may have different temporal components, i.e. having different cycles, phases or frequencies.

In an example, a first fingerprint sub-model may refer to variation of the parameter across a small area of the substrate whereas a second fingerprint sub-model may refer to variation of the parameter across the whole substrate. In an example, a first fingerprint sub-model may relate to an intrafield profile, and the first evolution sub-model may have a temporal cycle of approximately 3 months. In this example, the sampling scheme may be generated based on the first fingerprint sub-model and the first evolution sub-model which may specify very dense measurements over a partial area of the substrate every 3 months. A second fingerprint sub-model may relate to the whole substrate area and may be represented a parabolic model but has an evolution sub-model with a cycle of approximately 1 day. A second sampling scheme may be generated based on the second fingerprint sub-model and the second evolution sub-model in which fewer measurements over the area of the substrate are taken, but at a higher frequency, e.g. daily.

The fingerprint model and the evolution model referred to above may actually refer to multiple models. There may be multiple fingerprint models per device. For example, there may be fingerprint models with high spatial frequency components and fingerprint models with lower spatial frequency components. The different fingerprint models may be sampled and scheduled separately from each other to account for the differences between the fingerprint models, for example, the high spatial frequency components are likely to fluctuate slower in time than the low spatial frequency components. Multiple fingerprint models and/or multiple evolution models may be obtained for the device relating to multiple processing parameters. In other words, a first fingerprint model and evolution model (or a first set of sub-models) may relate to a first parameter, such as a characteristic of measurements from an alignment measurement tool (for example only), and a second fingerprint model and a second evolution model (or a second set of sub-models) may relate to a second parameter, such as a characteristic of a measurement from a level measurement tool (for example only). An individual sampling scheme may be determined for different ones of the multiple processing parameters based on the fingerprint and evolution models corresponding to each of the parameters. In other words, there may be a fingerprint model and a corresponding evolution model for a first processing parameter. Alternatively, the sampling scheme may be generated based on multiple fingerprint models and/or multiple evolution models. This way, the sampling scheme may take multiple processing parameters into account when providing an indication of when and where to sample.

An individual sampling scheme may be determined for the first processing parameter. There may also be a fingerprint model and an evolution model for a second processing parameter. An individual sampling scheme may be determined for the second processing parameter. Thus, the generation of the sampling scheme may be dependent on the specific processing parameter being referred to. This is advantageous because the processing parameters may vary in different ways. Thus, for example, the way in which the processing parameter varies over time may differ and thus the evolution model of different processing parameters may be different to one another. This may mean that it is beneficial to measure to obtain information relating to a first processing parameter much more frequently than carrying out measurements for a second processing parameter. For example, this may be the case if the first processing parameter has a larger variation and quickly reaches a threshold value which is not reached by the other processing parameters. Additionally a sampling scheme for the second processing parameter may be based on the sampling scheme for the first processing parameter when it is known that the first processing parameter correlates with the second processing parameter. For example, it is known that an Edge Placement Error (first processing parameter, typically measured using an e-beam metrology tool) depends on the overlay error (second processing parameter, typically measured using a scatterometer tool), hence a sampling scheme configured for the e-beam metrology tool may inherit certain properties (spatial density, temporal scheduling) of an existing sampling scheme derived for a scatterometer tool.

It is described above that the sampling scheme is based on the fingerprint model and the evolution model. Additional factors may also be considered in generation of the sampling scheme. Thus, the sampling scheme may take account of at least one additional factor.

The at least one additional factor may include an expected timescale for carrying out maintenance for the device. For example, if a device has a known frequency for having maintenance, such as every 6 months, the sampling scheme may be adapted to include this information and may determine that measurements are to be scheduled for relatively soon, e.g. a few hours or a day after maintenance. It might be the case that no drift of the device is expected but the device undergoes maintenance every 3 weeks. This information could be used to generate a sampling scheme to sample just after the maintenance to ensure that the device is functioning correctly after maintenance. Thus, the fingerprint model could then also be updated every 3 weeks.

The at least one additional factor may include device measurement data. The device measurement data may relate to information about the device used to process the substrate. The device measurement data may relate to a condition of the device. The measurement data may indicate a status of at least one device used for processing of the substrates. The device measurement data may be obtained from sensors relating to the device (rather than sensors used to detect parameters on the substrate). For example, a temperature of the device may be measured. If the temperature is higher than expected, the sampling scheme may schedule measurements to be taken more frequently and/or more densely in case the increased temperature increases the impact of the device on parameters on the substrate. The device measurement data may be used more generally to determine if a device is stable or unstable. If the device appears to be stable, the normal evolution model may be used to determine the sampling scheme. However, if the device is unstable, the sampling scheme may determine that measurements should be taken more frequently than would otherwise be indicated by the evolution model.

The at least one additional factor may include context data relating to the device used for processing the substrate. The context data may be associated with the use of at least one device. In other words, the context data may identify which device is being used to process a substrate. Thus, the context data may be referred to as device identification data. The fingerprint model may change depending on the device used to process the substrate. A previously described, a thread may be the devices used to process a substrate. The context data may provide an indication of the stability of devices used in that thread. Thus, if it is determined that a relatively unstable device is no longer used to process a substrate, the sampling may be reduced in frequency. If it is determined that a relatively unstable device is to be used to process a substrate, i.e. is introduced into the thread, the sampling may be increased in frequency. If it is determined that a device used to process the substrates, i.e. a device in the thread, is changed, then the sampling scheme may be updated to carry out the next measurements straight away or soon after the change of device.

The context data may be used when generating the fingerprint and/or evolution model. For example, it may be known that different contributors might lead to a specific fingerprint and it may be beneficial to separate the contributors to determine the fingerprint input from each contributor. For example, if a substrate is measured on two different substrate tables, it may be possible to see a difference in the shape of the substrate. If the shape of the substrate is known, then the impact of the shape of the substrate can be extracted from measurement data to obtain the shape of the substrate table. Different contributions may be known from different tests. For example, the shape of the substrate table may be determined from a substrate table cleaning test. Measurements may be carried out on two different layers of the same substrate. If the shape of the substrate is removed from the measurements then the difference between the layers can be determined. Thus, the shape of different contributors may be used to more accurately determine the fingerprint model and/or evolution model.

The at least one additional factor may include at least one user threshold value. A user may have specific parameters that they want to measure and control. Different users may rely on different key performance indicators. For example, a user may have a predetermined acceptable amount of overlay above which the error is too large. Thus, the user may provide an input which is a threshold value. The threshold value may be used to limit the sampling scheme in some way. For example, the user may specify that the frequency of measurements may not be below a threshold value. The user may specify that the expected change in the fingerprint model between sampling should be below a certain amount. In this way, the user can more closely maintain parameters of particular interest.

Figure 9:
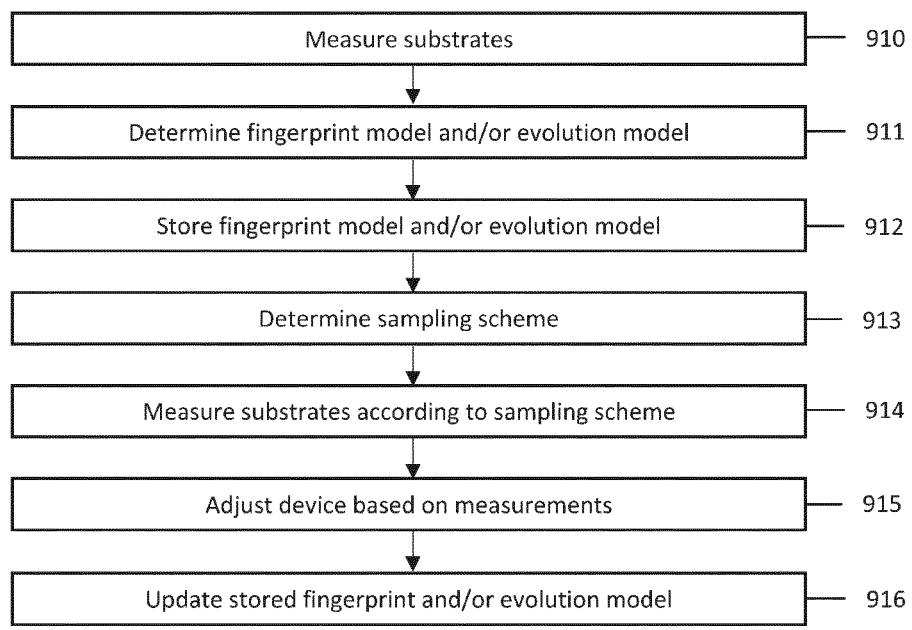
FIG. 9 illustrates a method including optional steps relating to determining a sampling scheme and shows how the sampling scheme may be used.

FIG. 9 depicts a method in accordance with an embodiment of the invention which shows various optional features relating to determination of models used for determining the sampling scheme and steps for how the sampling scheme can be used. In further detail, initial sampling may be carried out by measuring substrates in step 910. The method may include determining the fingerprint model and/or the evolution model in step 911 using any of the above described methods. The fingerprint model and/or evolution model may be stored in step 912. The sampling scheme may be determined in step 913. Step 913 may encompass at least steps 902 and 903 from FIG. 8, and may include step 901 if the appropriate model information has not already been obtained. Step 913 relates to determining the sampling scheme as described above. In step 914 substrates may be measured according to the sampling scheme. The method may include adjusting settings of the devices used to process substrates based on the measurements in step 915. Additionally or alternatively to step 915, the fingerprint model and/or the evolution model may be updated in step 916 based on the measurements carried out in step 914. Most of these steps are optional. Step 916 may be provided before step 915. Further detail for each of these steps is described below.

As will be described below, once the sampling scheme is generated, the sampling scheme can be used in a variety of ways.

Optionally, the method further comprises taking measurements of the at least one substrate according to the sampling scheme, as in step 914 of FIG. 9. These measurements are of at least one parameter of at least one substrate generated in a production flow. The sampling scheme provides instructions for when and where to sample, and possible even how to sample. For example, the sampling scheme may provide an indication of an area to sample and/or a frequency at which to sample. The sampling scheme may optionally also indicate what type of sensor should be used based on the type of parameter being measured. This beneficially measures substrates according to the sampling scheme to more efficiently measure substrates processed by devices.

The measurements may relate to various aspects of the substrate. The measurements may relate to the processing parameter of the at least one substrate. Thus, the sampling scheme can be used to determine when measurements for that processing parameter are to be taken. The measurements may be carried out automatically, and may, for example, be controlled according to the sampling scheme by a separate control loop. Measurements may be carried out by a user.

The method may optionally also include processing at least one substrate. Thus, the method may include processing the substrate using the at least one device. The processing of the substrate (optionally including at least one structure on the substrate) may include manufacture, in which the substrate is patterned. In other words, the processing may include a process of patterning substrates. The device may be used to carry out at least one of various different processes on the substrate. For example, the device may be an etching device or any other device previously described. The method may include processing at least one substrate using a number of devices, the devices may be used to carry out multiple different types of process on the at least one substrate.

Optionally, the method may further comprise a step of adjusting a setting of the device, as in step 915 of FIG. 9. The setting of the device may be adjusted using the measurements of the at least one substrate. This may be done as part of the processing control scheme as described below. This may be done to alter the impact of the device on the processing parameter. In other words, the sampling scheme may be used to determine when and where to take measurements. The measurements may then be used to counteract the impact of a device on a substrate. For example, if a device is having an increasingly large effect on the substrate, it may be determined that there is a certain amount of device drift which can be accounted for (and possibly reduced) by altering at least one setting of the device. The measurement data generated in the production flow could be used to control a device such that its contribution is reset to its original value. This may be referred to as reestablishing a baseline for the device. The skilled person would understand that the setting of the device may refer to various different factors of the device and may simply refer to some form of mechanical realignment.

Additionally or alternatively, the measurements taken according to the sampling scheme may be used to update the fingerprint model and/or the evolution model as in step 916 of FIG. 9. The measurement data can be analysed to determine a change in the parameter relating to the stored fingerprint and/or evolution models. The fingerprint model and/or evolution model can be updated using the measurements of the at least one substrate. This is beneficial in that the models can be kept more up to date based on additional, up to date information. This could be done frequently, and optionally continuously, to provide a dynamic fingerprint model library and/or evolution model library.

Furthermore, the method may include analyzing the updated fingerprint model and/or the updated evolution model and generating an updated sampling scheme for the device using the updated models. In other words, the method may include dynamically updating the sampling scheme to account for ongoing variation in the impact of the device.

The method may include adjusting a setting of the device in addition to updating the fingerprint model and/or the updated evolution model. Thus, the setting of a device may be updated and adjusted after the sampling scheme is dynamically updated. This allows the setting of the device to be adjusted to alter the impact of the device from a processing parameter based on the most up to date version of the fingerprint model and/or the evolution model. The setting of a device may be updated and adjusted before the sampling scheme is dynamically updated. This allows the fingerprint model and/or the evolution model to be updated based on the most recent settings of the device. Either way, measurements may be taken immediately or soon after a device is adjusted to account for the variation in impact of the device. The setting of a device may be updated as part of the processing control scheme as described below.

The fingerprint model may be obtained in various different ways. For example, obtaining the fingerprint may include generating the fingerprint model based on measurements and/or fingerprint data, relating to the processing parameter of at least one substrate having been processed by the device and/or at least one further device. The method may optionally include generating the fingerprint model. Various information and data may be used to generate the fingerprint model. There are known methods for generating a fingerprint model based on measurements for process parameters and/or fingerprint data. Alternatively, the method may simply obtain a fingerprint model by receiving the information for a fingerprint model without having to generate the model itself. For example, a general fingerprint model for the device may be used as an initial fingerprint model. This may be provided from an external computing system or could be provided with the device.

The method may optionally include carrying out initial measurements to determine the fingerprint model and/or evolution model for at least one device, as in step 910 of FIG. 9. This may include oversampling a parameter. Dense sampling can be used to obtain information about the parameter and drift of the at least device. This can be used to determine the initial fingerprint model and/or evolution model, as in step 911 of FIG. 9.

Fingerprint related data, fingerprint models and/or evolution models for a given device may be stored in a library, as in step 912 of FIG. 9. The fingerprint data may have corresponding time information to identify when the fingerprint data was measured and/or when the fingerprint model was generated. Fingerprint related data, fingerprint models and/or evolution models relating to multiple devices may be stored in the same library, or multiple libraries.

There may be multiple devices which impact a parameter of a substrate. It may not be clear how each of the devices has contributed to a fingerprint of a processing parameter. It is described above how a contribution of a device to a fingerprint of a processing parameter can be determined. The method may include deriving a fingerprint model by determining a contribution of the device to a fingerprint of a processing parameter as described above. In other words, the method may further comprise obtaining a processing parameter data and usage data, wherein the processing parameter data is based on measurements for multiple substrates having been processed by a plurality of devices, and the usage data indicates which of the devices out of the plurality of devices were used in the processing of each substrate. The contribution may be determined using the usage data and the processing parameter data. Further details relating to this determination are described in the examples above and can be incorporated into the present invention. Any combination of the exemplary methods described above for determining contribution of the fingerprint can be used for deriving a fingerprint model to be used for determining a sampling scheme.

In some scenarios, a substrate may be processed by two different devices and measurements may be taken after the substrate is processed by both of those devices. Computational metrology techniques may be used to isolate a contributor from other contributors by subtracting known fingerprint data associated with the other contributors from the overall measured fingerprint. The fingerprint model may be derived by obtaining a measurement of a processing parameter of a substrate processed by a first device and a second device (i.e. a further device). Thus, to obtain the fingerprint model relating to a device of interest (e.g. the first device), a fingerprint associated with the second device can be subtracted from a fingerprint obtained by the measurements to determine the contribution of the first device of a substrate processed by the device and the further device.

Specifically, it is preferable if the fingerprints are isolated for each device. The fingerprint may be further isolated to a specific aspect, e.g. a particular chamber, within that device. For example, it may be advantageous to isolate the scanner contribution to a fingerprint. It is possible to subtract the scanner from the measured overlay (or other parameter such as critical dimension) map. In the corrected measurements, no scanner impact should remain, such that we can fit, e.g. an etch fingerprint of one of the two layers with an etcher specific model. When the etch fingerprint is also removed from the measured data, we can model the residual, for example, with a CMP model if CMP was used between the two layer exposures. This is called "peeling the onion" concept.

The cleaned fingerprints can be made available and can be indexed by a thread (identification of what apparatus have been used to process a certain layer on the substrate) and/or time. Regular mathematical analysis can be used to establish a library of fingerprints per device, or even for a specific part of a device, for example, an etch chamber. The fingerprints can include device specific fingerprint evolution parameterization. The devices can be individually characterized to determine the drift of the specific fingerprint for that device over time. For example, an overlay fingerprint may be determined based on a cleaned overlay fingerprint (in which contribution from a scanner has been removed). From the overlay fingerprint, it may be identified that an etch chamber of an etching tool has a pronounced edge roll off contribution to the overlay fingerprint, for example from 0 to 3 nm radially from centre to the edge of the substrate. This information can be stored as the fingerprint model and can be used to determine the sampling scheme as described above.

Fingerprint models can be determined based on context information, for example, from principal component analysis (PCA) and/or machine learning. An example for determine fingerprint models in this way is described in WO2015049087 (incorporated by reference herein in its entirety). Fingerprint models can also be based on computational metrology, as described in WO2017144379 (incorporated by reference herein in its entirety).

Determining the evolution model is useful because it provides an indication for how the fingerprint data changes over time. Thus, the evolution model can be used to generate the sampling scheme because the number of measurements taken in certain areas within a certain time frame will depend on various factors, such as what information is known, what information is needed, and the rate of change of the fingerprint data. For example, if the evolution model shows that the change in the fingerprint is relatively slow, this may mean that less frequent sampling is needed and the sampling scheme can account for this.

The evolution model may be obtained in various different ways. The evolution model relates to how the fingerprint data/model varies over time. The fingerprint data may be analysed to determine a best fit. The evolution may be a simple linear model determined by comparing fingerprint data at multiple time instances. The evolution model may be of a higher order. The evolution model may be of any appropriate order. For example, the evolution model may be a first or second order. The evolution model could be a higher order polynomial, such as a $5^{th}$ or 6 h order.

The method may include carrying out measurements to determine the evolution model. The method may include oversampling a substrate, or multiple substrates, to determine the rate of change of a fingerprint. The method may further comprise an analysis step to determine correlation between the fingerprint model and the change of the fingerprint. This could be measured, for example, if the sampling rate is high enough to track any change of the fingerprint data. Sampling may need to be increased in certain areas to obtain enough information to track the change of the fingerprint data to determine the evolution model. Correlation steps can be carried out to check the validity of the evolution model.

Obtaining an evolution model for the processing parameter may include generating the evolution model. Thus, the method may include generating the evolution model. The evolution model may be generated by comparing measurements and/or fingerprint data at a first time instance with measurements and/or fingerprint data at a second time instance. In other words, the measurements and/or fingerprint data may be compared at two different times. The measurements and/or fingerprint data may relate to a processing parameter so that they can be used to determine a change of the processing parameter between these two time instances. The time difference between the first time instance and the second time instance may be varied or may be set. There may be a preferred time gap between the first time instance and the second time instance. This may be based on expected evolution of the fingerprint model. Ideally, the first time instance and the second time instance are close enough together such that variation in the fingerprint model can be accurately shown in the evolution model.

In an example described above, a fingerprint model is determined for an etch chamber. The example included that an etch chamber has a pronounced edge roll off contribution to the overlay fingerprint from 0 to 3 nm radially from centre to the edge of the substrate. It may be further determined that the etching chamber has a drift constant of 1 month (scaling with FP(t)=exp(C*t/tau)*FP(t=0). This information can be stored as an evolution model, corresponding to the earlier exemplary fingerprint model. The evolution model can be used to determine the sampling scheme as described above.

Various different techniques may be used to determine the evolution model. For example, the evolution model may be determined using a decomposition technique. The fingerprint data can be parameterized to obtain an evolution model for the fingerprint over space and time. If the variation in fingerprint data can be completely parameterized, then accurate evolution of a device can be determined. Evolution parameterization (e.g. based on time scales) is helpful to interpolate and/or extrapolate between measurements. This can lead to an extra source of virtual measurement data to increase accuracy of computational metrology based solutions. The extrapolated data can be extracted from measurement data to improve cleaning of measurement data from known contributors.

In an example, interfield content modelling can be used to compare fingerprint models between a first layer of a substrate and a second layer of a substrate, (i.e. between two different layers of a substrate). Optionally, raw data, i.e. unfiltered data, may be used to generate a map of a parameter for a specific layer. For example only, a level sensor map is referred to below, but it is understood that different or additional parameter measurements/information may be used. The difference in height detected by a level sensor can be an important indicator for process related contamination and/or when such contamination appears to be consistent across the substrate the height can be an important indicator for contamination of a substrate table being used to support the substrate.

The presence of focus spots may be determined and/or obtained such that a predetermined value may be determined as a critical allowable variation between specific layers. The interfield fingerprints can be monitored for process stability. The focus spot data correlates with yield and hence, can also be used to determine expected yield, e.g. an expected number of usable dies per substrate. In this way, the evolution of a fingerprint, which can change for various reasons e.g. due to contamination due to a process/device and/or contamination of a substrate table during processing, can be determined based on looking at the difference between exposures of a substrate, from layer to layer. Fingerprints or contaminations can be determined, for example, based on a difference between a first height map and a second height map. A map of the differences may be determined, showing the change from the first height map to the second height map. The sampling control scheme may be controlled to measure relevant parameters more than may otherwise be needed. This may beneficially provide redundant information to help monitor variation of typical fingerprints. The redundant information can be used to improve robustness of the evolution model and can be used to look at the variation of the evolution model over time. Thus, redundant information measured by measurement tools may be used to help machine learning described in further detail below.

Methods for determining evolution of fingerprints are described above. For example, fingerprints can scale, new fingerprints may emerge, fingerprints may disappear. This is described in the above examples relating to methods for maintaining fingerprints. In particular, FIG. 3 describes the concept of keeping track of evolving fingerprints. First a reference library of fingerprints is established (historic data), new data is decomposed into this set of reference fingerprints and evolution of a fingerprint becomes apparent when a) adaptation of the fingerprint is needed to explain the difference (in case the new fingerprint components are similar in geometry compared to the reference set) or b) new components need to be added to the reference set of fingerprints in order for the new data to have a basis in the set of reference fingerprints. Further details relating to this determination are described in the examples above and can be incorporated into the present invention. Any combination of the exemplary methods described above for maintaining fingerprints can be used for deriving a fingerprint model to be used for determining an evolution model to be used for determining a sampling scheme.

As described above, the evolution model may represent a change in a fingerprint due processing over time. The evolution model may represent a change in a fingerprint from layer to layer of a substrate. Alternatively, the evolution model may represent a change in the fingerprint from substrate to substrate.

In a specific example, the fingerprint may be determined based on measurements of a specific substrate in a batch of substrates e.g. the first substrate. An evolution model may be used to determine the variation of the fingerprint on corresponding layers of other substrates in the batch. In other words, the evolution model may represent the variation of the fingerprint from substrate to substrate. The same layer in each substrate may be compared, e.g. the first layer in the first substrate and the first layer in the fifth substrate, to obtain the evolution model. The evolution model may provide enough information that further sampling is not needed and/or is not time efficient. Thus, the sampling scheme may determine that only a single substrate in a batch (e.g. the first substrate, or another substrate if a different substrate is measured out of the batch) is measured, and the processing of the remaining substrates in the batch is carried out based on those measurements and the evolution model. This may be the case if there is not a lot of variation from substrate to substrate within one batch, and/or if the variation between substrates in a batch is consistent and can be accounted for, i.e. if the evolution is particularly stable. Thus, in a most extreme case, a single substrate in a batch may be measured to determine a fingerprint, and then, based on the fingerprint model and evolution model, it may be determined that no further measurements are taken during processing that batch of substrates.

Alternatively, the evolution model may represent the variation from layer to layer as well as, or instead of, from substrate to substrate. It may be determined from the evolution model that the process steps used between the layers do not significantly alter the topography of the substrate. In other words, variation between the layers may be small. In this case, it may be determined that only one layer per substrate is measured. For example, measurement(s) of one layer may be carried out and the evolution model may be used to predict the variation from layer to layer for that substrate.

Both these particular examples may be beneficial in recognizing that when the variation from substrate to substrate and/or from layer to layer is very small, it may be more efficient to reduce the sampling to at least one specifically determined layer and/or substrate. This can reduce overall measurement time whilst ensuring that acceptable exposure performance is achieved.

These methods may be used for any of the parameters described above. In an example, these methods may be used for determining when/how to carry out the measurements using a level sensor. For example, the fingerprint data for a substrate may be determined e.g. from initial measurements. An evolution model may be determined, e.g. based on further measurements, showing variation from layer to layer in at least one substrate and/or variation from substrate to substrate. As described above, at least one additional factor such as context data (e.g. process knowledge, substrate thickness, etc.) may be considered in the generation of the sampling scheme. For example, the context data may be used when determining the evolution model. The sampling control scheme may then be generated to reduce the number of measurements taken by the level sensor. For example, the number of measurements may be greatly reduced and the evolution and fingerprint model may be used to predict characteristics of the substrates (e.g. predicted level sensor height maps) which may be used to control processing of the substrate. It may be determined that only one measurement is taken per batch of substrates. This may be particularly useful in that information based on previous measurements can be used to calculate and predict parameters of different layers and/or substrates without further need to measure additional substrates. This can be beneficial in that measuring time for a particular parameter is reduced which can mean that the processing of the substrate can be carried out more quickly and/or other measurements can be carried out which may reduce errors and lead to a larger number of usable dies/substrates being manufactured (i.e. to increase throughput).

In the above described examples, the evolution model can be used to determine a sampling control scheme as described above. Based on this, measurements may be taken at selected locations after specific periods of time to reconstruct low-frequency approximations of the parameter fingerprint. This could then be compared to the expected parameter fingerprint based on the evolution model.

Alternatively, as mentioned above, more measurements may be made per batch than needed for accurate processing, i.e. some redundant measurements may be made within the sampling control scheme. These additional measurements may be used as feedback to the fingerprint and/or evolution models and can thus be used to verify and/or enrich the fingerprint and/or evolution models respectively.

Whether or not the sampling control scheme keeps the amount of sampling at a minimum, or includes some redundant measurements to improve the robustness of the models, the overall amount of measurements by a device may be intelligently controlled using the sampling control/schedule. The sampling control scheme can thus be determined to provide distributed sampling methods which optimize the ratio of measurement time to information density. This reduces the risk of measuring more than necessary on a layer to layer and/or substrate to substrate basis. This means that valuable measurement time (e.g. measuring using a first metrology system such as a level sensor) can be used to potentially make more important measurements (e.g. by other devices such as a second metrology system, such as for example an alignment sensor). In this example, it is possible that measurements (e.g. for levelling) may only be carried out prior to exposure, which may thus optimize the way the measurements are carried out whilst choosing acceptable exposure performance.

The sampling control scheme may be used to configure a metrology tool (such as a level sensor) for measuring a property (such as a level sensor height map) of a substrate subject to a manufacturing process. The evolution model may be based on expected variation of the property between a substrate and/or an expected variation of the property between stages of processing based on historic data comprising measured values of the property from multiple substrates at multiple stages of processing. The method may further comprise configuring the metrology tool based on an expected substrate to substrate variation of the property for a current stage of processing and/or an expected deviation of the property associated with the current stage of processing of the substrate compared to a previous stage of processing. In other words, the sample control scheme used to control a metrology tool, i.e. the way in which the measurements are taken by a specific device, can be based on the evolution model.

As mentioned briefly above, the measurements made by some measurement tools may be more valuable than the measurements made by other measurement tools. Thus, reducing the number of measurements taken by one sensor, e.g. a level sensor, may increase time availability for measurements by another sensor, e.g. an alignment sensor. The sampling measurement scheme may optimize measurements taken by multiple measurement tools. The sampling control scheme may balance input and measurements of one measurement tool with input and measurements of another measurement tool. Generally, the sampling control scheme may be used to indicate measurements to be taken by multiple devices. An additional factor accounted for in the sampling control scheme may be a known relationship between measurements taken by different tools (as described below).

There is a risk with known measurement systems/techniques that measurements may be carried out even though other measurements, i.e. by a different device, might be more usefully made. For example, time may be spent making a leveling measurement which could be better spent making an alignment measurement, or vice versa. The sampling control scheme may optimize measurements taken with multiple measurement tools. For example, instead of taking leveling and alignment measurements for all substrates and standard substrate portions, the measurements taken by one measurement tool may be balanced with the measurements taken by another measurement tool. This may be done by accounting for a known relationship between the measurements taken by the different measurement tools in the sampling control scheme.

It may be beneficial to base this balancing on a variability of data, e.g. where the previously measured data can be used without losing too much accuracy, and/or the how important the knowledge of that data is for a certain process performed. For example, focus critical processes may benefit more from more levelling measurements. However, overlay or alignment critical processes may benefit more from more alignments measurements. In an example using a level sensor and an alignment sensor, the measurements from the levelling measurement tool and the measurements from the alignment measurement tool may be made for at least one substrate i.e. to determine a fingerprint model for the characteristics measured by each measurement tool. At least one evolution model may be determined for characteristics based on measurements from the levelling measurement tool and/or the alignment measurement tool. The evolution models may show layer to layer and/or substrate to substrate variation. An evolution model may be obtained based on measurements from both of the measurement tools. The evolution model(s) may be used to determine characteristics or components that are not predictable based on historic and context data. The sampling control scheme may be generated using the evolution model(s) from both the measurement tools. The sampling control scheme may optionally take into account context data, e.g. process knowledge, substrate thickness, substrate height maps from offline tool, clamping models, etc. The sampling control scheme may optimize the level sensor and/or alignment sensor sampling based on said non-predictive components, given a certain measurement time budget and per layer criticality of the data (e g minimum required accuracy) to distribute measurements made by the alignment sensor and the level sensor across the substrates, layers and batches. The sampling control scheme may take into account the known relationship between measurements taken by the level sensor tool and the adjustment sensor tool. As a result, the level sensor and alignment sensor measurements may be balanced (co-optimized) to achieve an improved, or even optimal, level of inline acquisition of pre-exposure information allowing optimal exposure control in view of total process performance, e.g. across substrates and layers.

In other words, the method may include determining a sampling control scheme which can be used to control measurements made by at least one metrology tool as already described. However, in this this example, the sampling is used to co-optimize measurements taken by a first metrology tool and a second metrology tool based on variability observed in two different properties. The sampling control scheme may only apply to one measurement tool but may account for a known sampling scheme for another measurement tool.

In a specific example, it may be noted that level sensor measurements are particularly useful for noting out of plane distortions. The out of plane distortion may also be measured by an alignment sensor. There may be correlation, for example, at the edge of the substrate in which the out of plane distortion may be measured by either sensor. Therefore, only one sensor may be used, rather than both at the edge of the substrate. Alternatively, in other areas, it may be determined that each of the sensors provide useful information which cannot be obtained by the other, and therefore, both sensors may be used. This provides greater freedom when determining how measurements are to be taken in accordance with the sampling control scheme. It will be understood that the same principle may be applied to other measurement tools.

Parameter related data, the fingerprint model and/or the evolution model may be stored in a library. The fingerprint model and/or the evolution model may be obtained from the library. The library may be the equivalent of a database. The library may be stored in a memory storage unit. The memory storage unit may be provided in conjunction with other components and computer related devices. The library may be provided in several parts, for example with fingerprint related information in a first part and evolution related information in a second part.

The library of fingerprints may be associated with individual contributors. For example, the individual contributors may each relate to a specific device which impacts a parameter of the substrate. For example, individual contributors may include, but are not limited to, a scanner, an etcher, a deposition device, etc. The information stored in the library may be obtained by monitoring fingerprints of substrates being processed by a sufficiently varying amount of threads. It is preferable that the fingerprint data is provided with context, e.g. information indication particular devices have been used to process the substrate, e.g. which etch chamber, chuck, track, etc. and parameters establishing the observed evolution of the fingerprint if relevant.

The fingerprint model and/or the evolution model may be dynamically updated. The fingerprint model and/or the evolution model may be dynamically updated by context data and/or measurement data. For example, the evolution model may be updated using context data associated with the use of at least one device and/or measurement data indicating a status of at least one device used for processing of the substrates. This means that the evolution model can be updated to take account of information relating to the devices so that the evolution model is more up to date and the up to date information can be used to generate the sampling scheme.

The fingerprint model and/or evolution model may be an advanced model which may be continuously updated (trained) in order to be accurate for the status of the devices used for processing at any moment. Context and measurement data is vital to keep the fingerprint model up to data.

It may happen that new context data and/or measurement data indicates the contribution of a certain device to the processing parameter fingerprint is negligible (below threshold). In this case, the sampling scheme may be determined to skip a generation of measurement on a substrate according to that sampling scheme for the certain device.

The evolution model and/or the fingerprint model may be updated using machine learning. This means that information relating to the processing parameters and the sampling scheme may be used to determine how and when to update the evolution model and/or the fingerprint model. Generally, this means that the method may include analysis of the data from the measurements made, and/or variation in the fingerprint model, and/or variation in the evolution model. Ongoing measurement related information and analysis may be stored. The analysis may be used to recognize patterns in the information. The patterns can be used to predict future changes in the fingerprint model and/or evolution model. Thus, the method may learn how the fingerprint model and/or evolution model varies over time and use this to create a more efficient sampling scheme. The predictions can be used to predict an optimum sampling scheme.

For example, this may mean that the sampling scheme is changed less frequently which reduces the processing required for generating the sampling scheme. For example, analysis of the evolution model may indicate that there is a certain amount of drift which occurs over a set period of time. The method may take this into account and may use this variation of the evolution model as a base line for the evolution model. If this changes over time, analysis of the measurements may notice patterns in the variation of the evolution model and use this to update the evolution model.

Not every device used to process a substrate needs to be monitored and sampled in accordance with a sampling scheme. In other words, the sampling scheme may be based on only some of the devices in a thread. The sampling scheme may only be used for devices which have the largest effect on parameters of a substrate and/or devices which are determined to be more unstable than others.

The above described method provides details for determining sampling schemes for substrates to be processed by at least one device. The same method may be used to determine a processing control scheme for a device used for processing of substrates. Some examples of controlling devices based on the sampling scheme are described above briefly. More generally, the same analysis (which is described above for determining the sampling scheme) may be carried out on a fingerprint model and evolution model to generate a processing control scheme. This may be instead of, or in addition to, generating the sampling scheme described above.

The processing control scheme may provide an indication for how to control the processing of the substrate. The processing control scheme is generated based on the evolution model and the fingerprint model. The indication may comprise a specific aspect of the substrate being processed by at least one device, such as a preferred position of the substrate (e.g. when being processed by a particular device) and/or a preferred overall shape of the substrate (e.g. when being processed by a particular device). The indication may specify how to control the device, e.g. the indication may comprise a preferred setting for position control of the substrate and/or a preferred setting of a lens manipulator of the device and/or a preferred setting for controlling the shape of the substrate. The indication may comprise information for adjusting at least one device used to process the substrate, for example, information used to adjust a lens in a lithographic apparatus used to process the substrate.

It may be determined that there is a drift of at least one of the devices over time, which is represented in the evolution model. Thus, the preferred position of the substrate relative to that device may be slightly different over time as the impact of the device drifts. Thus, the processing control scheme could be used to account for this drift by changing the preferred position of the substrate over time to account for the drift. The method may further comprise adjusting or controlling a position of the substrate based on the processing control scheme. For example, the processing control scheme could be implemented by actuators used to control the position of the device to reduce the drift of the device relative to at least one substrate over time.

It may be determined that at least one device affects the overall shape of the substrate in an undesirable way over time. Thus, the processing control scheme could be used to account for this change in overall shape of the substrate in various ways. For example, the processing control scheme may include information for altering the device, and/or for carrying out an additional processing step on the substrate, and/or for positioning the substrate relative to the devices such that the impact of the shape change is reduced. The method may further comprise adjusting or controlling a the shape of the substrate, adjusting which devices are used to process a substrate, and/or controlling a position of the substrate using on the processing control scheme. For example, the processing control scheme could be used by actuators used to control the shape and/or position of the device to reduce the variation in the overall shape of the substrate over time.

The indication for how to control the processing of the substrate may comprise information for adjusting at least one device used to process the substrate. In other words, the indication may include specific details for adjusting a setting of a device used to process the substrate. For example, it may be beneficial to determine that the impact of a specific device or component drifts over time. Thus, instead of adapting the position of the substrate for example, as described above, the device itself could be adjusted to take the variation of the impact of that device or component into account. Ideally, this may result in the device being reset to an initial setting which minimizes or reduces the variation in the impact on the substrate. The method may further comprise adjusting or controlling the device based on the processing control scheme. For example, the processing control scheme could be used by at least a part of a device, for example, an actuator in the lithographic apparatus may control a lens used to process the substrate and the actuator may adjust the lens (e.g. the position or orientation of a lens element) based on the processing control scheme.

As described in some of the examples above, the method may further comprise the step of controlling the processing of the substrate using the indication for how to control the processing of the substrate. Thus, the method may comprise the actual steps to implement the indication determined form the analysis of the fingerprint model and/or evolution model.

Additionally, or alternatively, the present invention may provide a method of determining, for a substrate processed by multiple devices, which of the multiples devices contributed to a fingerprint of a processing parameter of a substrate. Thus, the method may be used to diagnose an error in a substrate processed by multiple devices. The method of determining which of the multiple devices contributed to a fingerprint of a processing parameter may be the same as the above described method for generating a sampling scheme. However, instead of specifically generating a sampling scheme, the analysis of the fingerprint and evolution model are used to determine which of the multiple devices contributed to a fingerprint of a processing parameter. This would be beneficial in identifying a specific one of the multiple devices used to process a substrate which contributes to an error, e.g. the overlay, on that substrate. Additionally, the method may comprise adjusting at least one of the devices used to process a substrate based on the identification. In other words, for the device from the multiple devices which is determined as having contributed to a fingerprint of a processing parameter of said substrate, the method may further comprise adjusting the settings for said device based on the determined contribution. The device may be adjusted to reduce or remove the contribution of the device on the fingerprint of the processing parameter.

The step of determining which of the multiples devices contributed to a fingerprint of a processing parameter of a substrate may use analysis of the fingerprint and evolution models and may also use known processing parameter information of the multiple devices. Thus, for example, the known fingerprint model or evolution model for at least one device may be compared to the fingerprint model and/or evolution model of the substrate processed by multiple devices. The comparison can be used to determine which device has fingerprint and/or evolution data which most closely matches the models. Known computational methods may be used, for example, by determining which device has information with the minimum residuals when compared to the fingerprint model and evolution model. The known information which most closely matches the fingerprint model and/or evolution model may be determined to be the device which contributed, or at least contributed more than the other devices, to a specific fingerprint.

The method may further comprise a step of decomposing fingerprint data to generate at least one set of component data. The fingerprint model may comprise the at least one set of component data. Thus, the at least one set of component data may be considered to be fingerprint sub-models as described above. In this case, the overall fingerprint model may comprise multiple fingerprint models, with each fingerprint model corresponding to a set of component data. The set of component data is the data across at least a part of the substrate from decomposing the overall fingerprint data or overall fingerprint model. The fingerprint data which is decomposed may be in various forms. The fingerprint data which is decomposed may be expressed as an initial fingerprint model which is further decomposed into an updated fingerprint model which is used for analysis as described.

Figure 10:
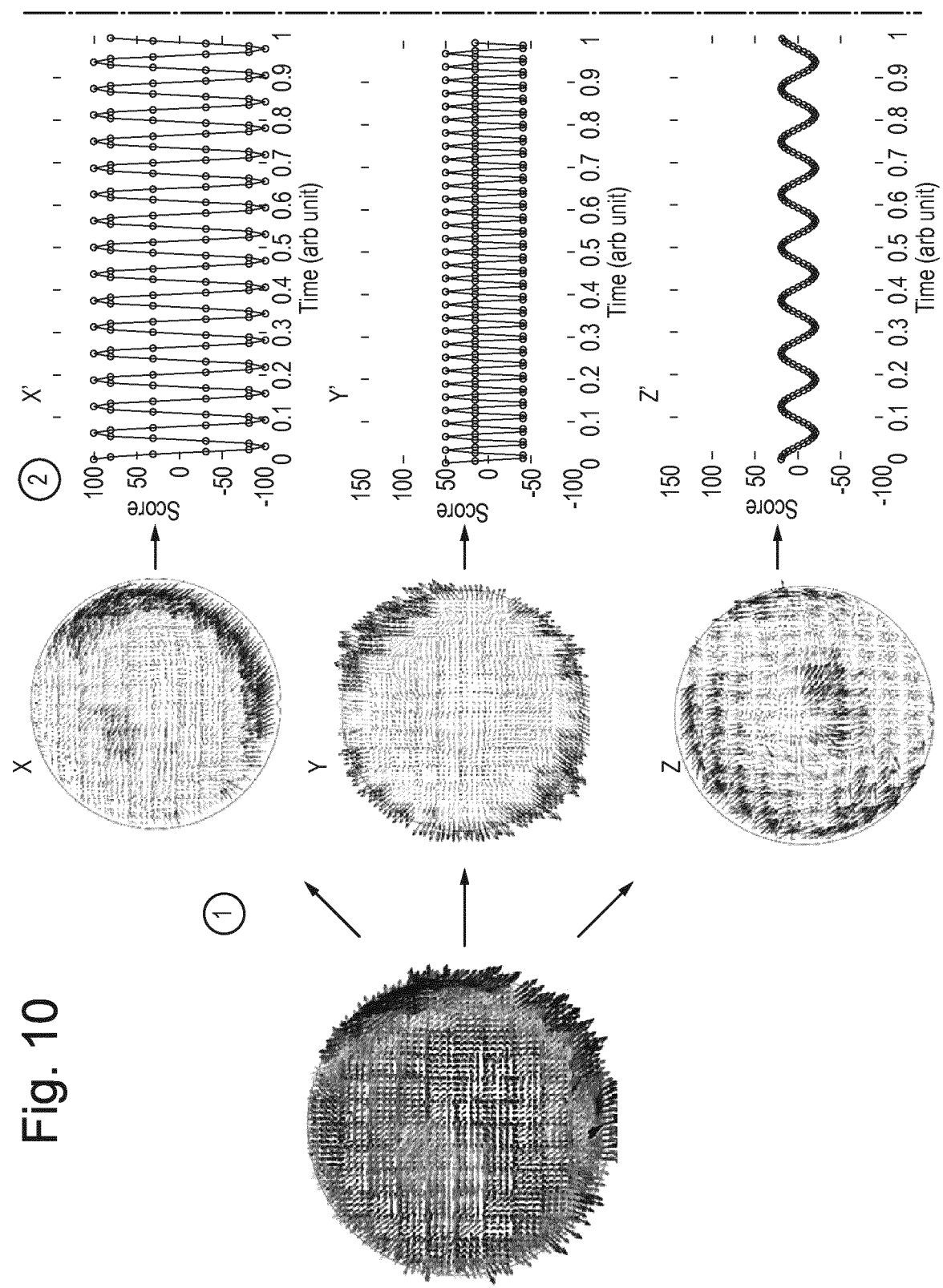
FIG. 10 illustrates a method of analyzing fingerprint and evolution data.
Figure 10:
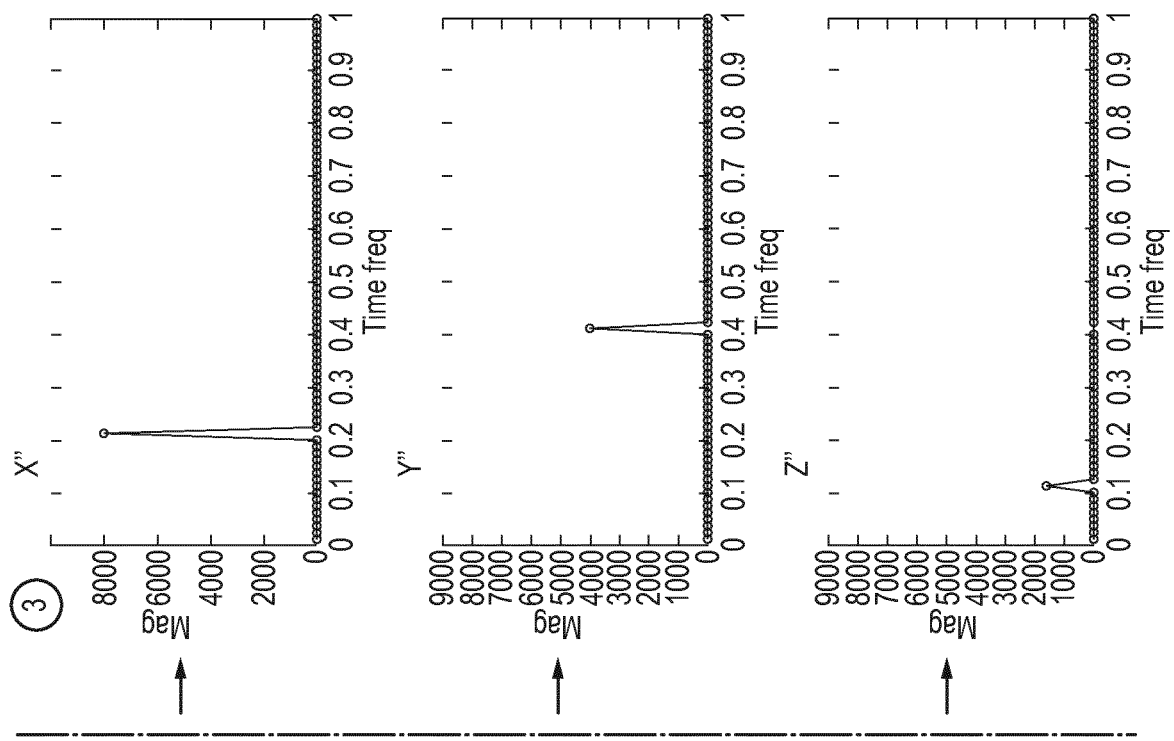

An example of decomposing the fingerprint data (or an initial fingerprint model) into several sets of component data is shown as step 1 of FIG. 10. As shown the fingerprint data (or initial fingerprint model) is decomposed into three sets of component data, X, Y and Z. Each set of component data may correspond to a fingerprint sub-model as described above.

The fingerprint data can be decomposed in many different ways. The decomposition step may be a mathematical decomposition. For example, principle component analysis can be carried out on the overall fingerprint data and/or fingerprint model. Principle component analysis can be used to determine the component data shown by the three sets of component data X, Y and Z in FIG. 10. Additionally or alternatively, computational metrology may be used. Each set of component data may represent physical aspects of the substrate. The sets of component data may be combined to form the original fingerprint data (or initial fingerprint model). As described above, the original fingerprint data (or initial fingerprint model) may be received or obtained from various sources. For example, the original fingerprint data may be obtained from measurements taken by a metrology tool.

The fingerprint data (or initial fingerprint model) may be decomposed by varying amounts. Thus, there may be different numbers of sets of component data. FIG. 10 shows that the fingerprint data is decomposed into three sets of component data (X, Y and Z) but the data may be decomposed into fewer or greater numbers of sets of component data.

The evolution model may be based on variation of the at least one set of component data over time. Thus, the evolution model may comprise multiple individual evolution models for each of the sets of component data. This is similar to the evolution sub-models as described above. This is shown in step 2 of FIG. 10 in which the evolution of each set of component data is calculated over time. The evolution of the set of component data is shown by the score vs time graphs for each of the sets of component data. The score may be, for example, the principle component analysis score of the fingerprint data as it changes over time. The time may be any arbitrary unit of time. The unit of time used to plot the different sets of component data should be consistent for the sets of component data. In the example shown in FIG. 10, an evolution model X' in the graph represents the variation over time of the set of component data X, an evolution model Y' in the graph represents the variation over time of the set of component data Y, and an evolution model Z' in the graph represents the variation over time of the set of component data Z.

The method may further comprise the step of transforming the evolution model (X', Y', Z') of the at least one set of component data. For example, this is shown in step 3 of FIG. 10, where the evolution model (X', Y', Z') for each set of component data (X, Y, Z) is transformed. More specifically, a Fourier transformation may be carried out on the evolution model (X', Y', Z') for the set of component data (X, Y, Z). Thus, the variation of each set of component data (X', Y', Z') over time can be transformed into a function of frequencies for that set of component data. In other words, a Fourier transformation is used to break down the evolution models for the at least one set of component data. The frequency data (X", Y", Z") is represented in the graphs on the right hand side of FIG. 10. The Fourier transformation is referred to here as a general method to transform the spatial or temporal information to corresponding spatial and temporal spectra. Other types of mathematical transformations yielding spectral information from spatial or temporal data can also be used. The method may further comprise identifying a dominating frequency for the transformed evolution model of the at least one set of component data. The broken down evolution model can be used to identify a frequency range for each of the at least one set of component data. The frequency range identified may indicate the dominating frequency for each component. The dominating frequency may simply be the frequency which corresponds to the peak frequency of the transformed evolution model. In other words, the dominating frequency is the frequency with the maximum amplitude of the spectrum, or in other words the frequency with maximum energy. This can also be called peak frequency. The dominating frequencies are illustrated by the graphs on the right-hand side of FIG. 10 as the peaks shown in the graphs. Thus, the Fourier transformation can be used to identify dominating frequencies.

The graph showing frequency data X" represents the set of component data X having been transformed and plotted to determine the dominating frequency. As shown in graph X", the sampling density requirement may be approximately 20%. This is indicated by the peak of the frequency plotted against time being at approximately 0.2. The sampling density requirement represents the number of substrates, out of the total number of substrates, sufficient to reconstruct the evolution of component data for all the substrates to be measured accurately. Thus, for example, if there are 100 substrates, and the sampling density frequency is 20%, then only 20 of the substrates may be measured and the evolution of component data could be accurately determined for all the substrates. In other words, there is no need to measure all of the substrates in this case. The substrates to be measured may be spaced out, for example if only 20 out of 100 substrates are measured, it may be the $1^{st}$, $6^{th}$, $11^{th}$, $16^{th}$ substrate and so on that are measured. The substrates to be measured may be equally spaced throughout the total number of substrates to accurately determine the evolution.

The graph showing frequency data Y" represents the set of component data Y having been transformed and plotted to determine the dominating frequency. As shown in graph Y", the sampling density requirement may be approximately 40%. This is indicated by the peak of the frequency plotted against time being at approximately 0.4. The graph showing frequency data Z" represents the set of component data Z having been transformed and plotted to determine the dominating frequency. As shown in graph Z", the sampling density requirement may be approximately 10%. This is indicated by the peak of the frequency plotted against time being at approximately 0.1.

The method may include determining a coherence time of the at least one set of component data. The coherence time may be inversely proportional to the dominating frequency of the at least one set of component data. For example, most simply, the coherence time may be k/(dominating frequency), wherein k is a proportionality constant. In general the dominating frequency might have some small uncertainty, which will create some small uncertainty in determination of coherence time. In that case a mean of the range can be used as mean coherence time. The coherence time may be the length of time in which the fingerprint is deemed to be stable. As the coherence time is inversely proportional to the dominating frequency, this means that a higher dominating frequency means lower coherence time, i.e. shorter periods of stability, and vice versa. Advantageously, because the fingerprint data (or initial fingerprint model) has been decomposed, it can be determined which of the specific sets of component data leads to which specific dominating frequency components. This is useful because it will be known which actuator is used to measure which component. Thereby, a sampling control scheme for the actuator can be optimized based on the relevant component. Additionally, this also means that one specific component can be correlated to one specific process parameter with a known frequency response, for example vibration frequency of substrate table. This can help identify the root cause. Generally, frequency components of the transformed evolution model which have a greater contribution are seen in the graphs as having higher magnitude.

As described below, the processing control scheme and/or the sampling scheme can be generated using the coherence time and/or dominating frequency. The dominating frequency and the coherence time may be used interchangeably as it is known that they are inversely proportional so a lower dominating frequency relates to a higher coherence time and vice versa.

As indicated above, lower dominating frequencies equate to more stable evolution models. Thus, sets of component data with lower dominating frequencies may not need to have such frequent sampling and/or control. This means that generally, a slow sampling or processing control scheme may be preferred. This could be implemented, for example, by using slower moving actuators for controlling the positioning of the substrate and/or for controlling measurement tools to sample the substrate, as fast moving actuator is not necessary. For example, a slow moving actuator may be preferred to control measurement tools to sample less frequently, for example, to sample only one substrate in every batch of substrates. A slow actuator means less frequent sampling and/or control.

In practice, higher dominating frequencies equate to less stable evolution models. Thus, sets of component data with higher dominating frequencies may need to have more frequent sampling and/or control to account for the more rapidly changing fingerprint. This means that generally, a fast sampling or processing control scheme may be preferred. Thus, for example, a fast moving actuator may be preferred, such as an actuator used to control measurement tools to sample every substrate.

Figure 11:
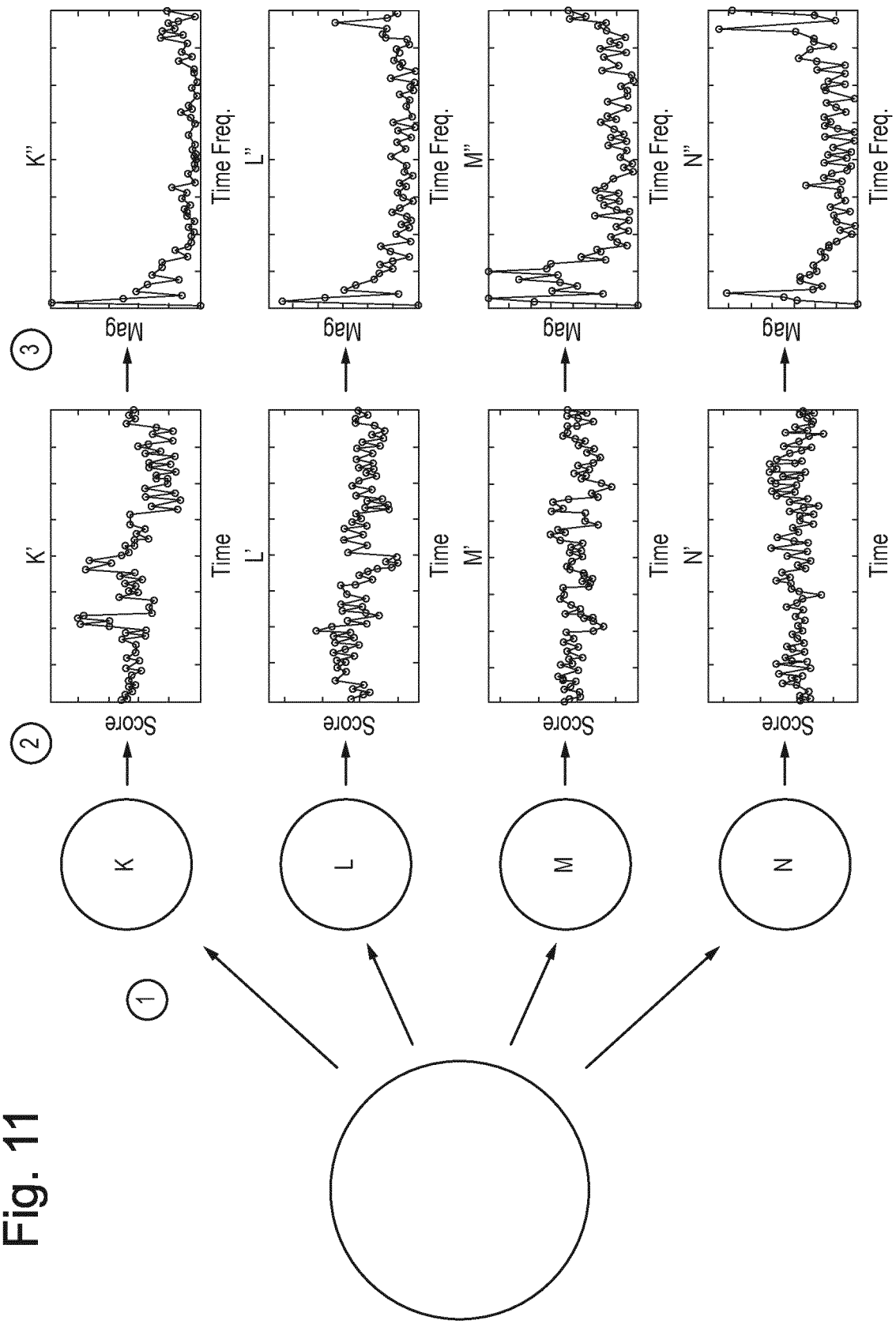
FIG. 11 shows similar analysis to FIG. 10 based on real data.

The graph shown in FIG. 10 is an example based on example data. However, FIG. 11 shows an example of the same steps as described above having been applied to real data. In this instance, the fingerprint data (or initial fingerprint model) is decomposed in the first step to four sets of component data (K, L, M, N) and the evolution models (K', L', M', N') are based on each of the four sets of component data (K, L, M, N).

As can be seen from FIG. 11, the temporal frequency data (K", L", M", N") of the real data set shown in the graphs on the rights hand side of FIG. 11 is slightly more spaced out than the example data set shown in FIG. 10. However, for example, it can be seen that frequency data K" has a generally dominant (i.e. larger) lower temporal frequency. Thus, slow moving actuation may be preferred. Frequency data L" has temporal frequencies which are dominant at the low and high end of the spectrum. This means that a fast moving actuator may be usefully provided and possibly an additional slow moving actuator. Frequency data M" shows that the dominant spectrum is in the low temporal frequency which means the slow moving actuator may be used. Frequency data N", similar to frequency data L", has low and high dominant frequencies meaning that a fast moving actuator may be used, possibly with the addition of a slow moving actuator.

Figure 12:
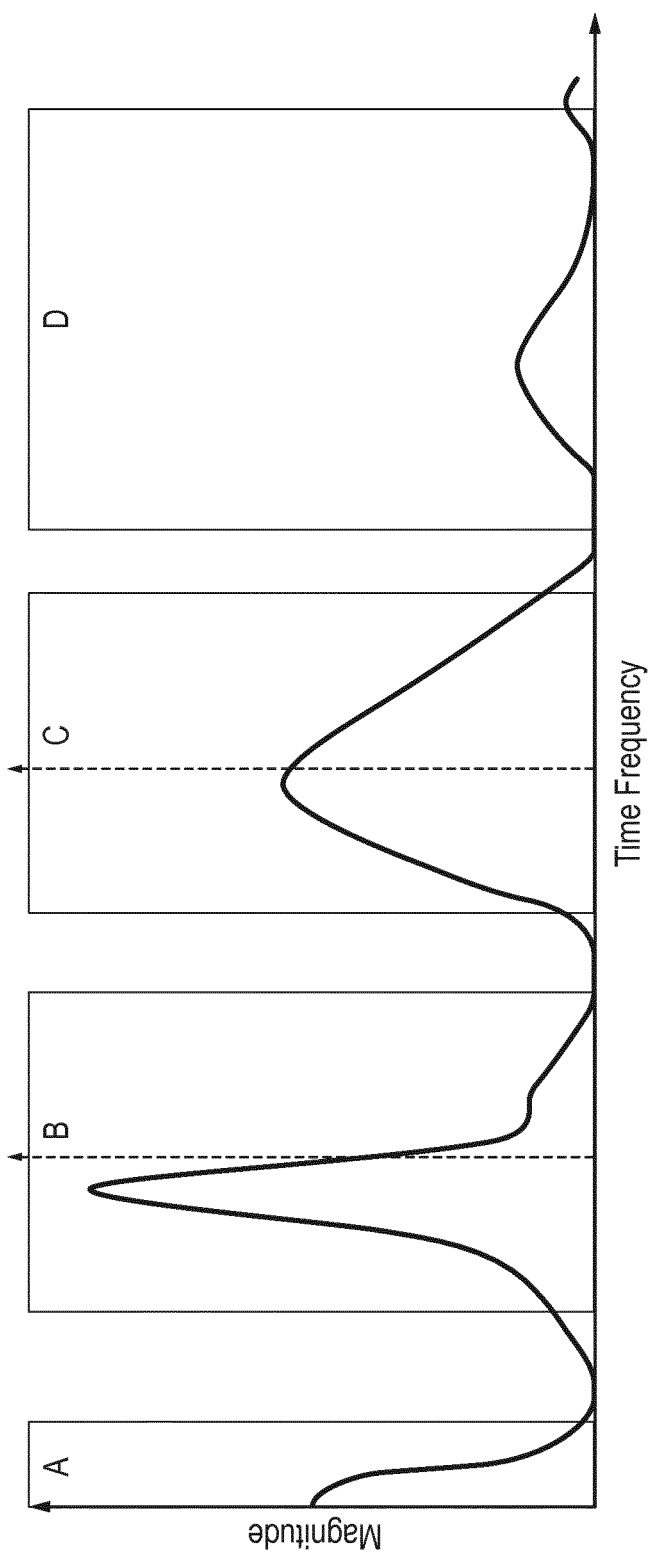
FIG. 12 illustrates an exemplary spectral magnitude against temporal frequency.

FIG. 12 shows an example of the temporal frequency with various dominant peaks shown at different frequencies. If the dominant frequency is in section A, this may mean that the sampling scheme and/or processing control scheme may be relatively slow. For example, the sampling scheme may indicate that only one substrate should be measured every batch and/or the processing control scheme may indicate that the control needs to be updated once every batch. This may correspond to the second set of component data Z shown in FIG. 10.

If the dominant frequency is in section B, this may mean that the sampling scheme and/or processing control scheme may be relatively slow, but faster than if the dominant frequency is in section A. For example, the sampling scheme may indicate that only one substrate should be measured every four or five substrates and/or the processing control scheme may indicate that the control needs to be updated every four or five substrates. This may correspond to the first set of component data X shown in FIG. 10.

If the dominant frequency is in section C, this may mean that the sampling scheme and/or processing control scheme may be relatively fast, e.g. using a faster actuator. For example, the sampling scheme may indicate that only every substrate should be measured and/or the processing control scheme may indicate that the control needs to be updated for every substrate. This may correspond to the second set of component data Y shown in FIG. 10.

If the dominant frequency is in section D of FIG. 12, this may mean that the sampling scheme and/or processing control scheme may be very fast. In some cases this may mean that the temporal frequency is too high to be corrected and/or measured with any presently known devices/control mechanisms. In this case, the variation may not be corrected or measured (i.e. with any presently known actuator/control mechanism) as the actuator/control mechanism may not be able to move fast enough. Thus, it may be better to remove this data set from the control fingerprint because if the variation cannot be controlled then the data in graphs and models for this set of component data amounts to noise. Thus, if the noise is removed then this improves the overall analysis, measurement and control.

FIG. 12 could be generalized to indicate that a fast moving actuator/measurement/control mechanism should be used for dominant frequencies in area C, a medium moving actuator/measurement/control mechanism should be used for dominant frequencies in section B, and a slow moving actuator/measurement/control mechanism should be used for dominant frequencies in section A.

When the analysis to determine the coherence time is carried out, the information can be used to find optimum sampling and/or processing control schemes. For example, the temporal sampling density (i.e. the temporal aspect of the sampling scheme) may be optimized by knowing the coherence time (or dominant frequency) which can aid in defining dynamic sampling. More specifically, the sampling scheme and/or processing control scheme can be optimized based on coherence time of the at least one set of component data.

The use of the measurement tool/actuator/control mechanism etc. may be optimized, for example by avoiding use of a fast measurement tools/actuators/control mechanisms etc. (which is more expensive) to control the fingerprint which is varying slowly, and vice versa. This makes the generation of usable substrates more efficient, because it means that fast measurement tools/actuators/control mechanisms etc. can be used for fast changing components of the fingerprint data and slow measurement tools/actuators/control mechanisms etc. can be used for slow changing components of the fingerprint data. As slower measurement tools/actuators/control mechanisms etc. tend to be cheaper, this means that more expensive, fast moving measurement tools/actuators/control mechanisms etc. are not used to measure slow changing fingerprints. In particular, this may be useful for co-optimization with data relating to multiple parameters.

The above described methods may be beneficial for improving the process for determining when and where to take measurements of the substrate and/or how to control the processing of the substrate. Thus, the method can be used to generate the sampling control scheme and/or a processing control scheme. The coherence time could also be used to determine a processing control scheme for other aspects of the device used to process a substrate, and not simply for the actuators used to control the position of the substrate as described in many of the examples above. For example, the processing control scheme may determine when adjustments need to be made to a lens used for irradiating a substrate and/or controlling the overall shape of the substrate itself.

When multiple devices are used to process a substrate, it may be known that the devices impact parameters of the substrate in different ways over time as previously described. The dominating frequency and/or coherence time may be used to diagnose errors in the substrate processed by multiple devices. The dominating frequency and/or coherence time of the at least one set of component data can be compared to known processing parameter information for the multiple devices and by comparison of the processing parameter information and the dominating frequency and/or coherence time, it can be determined which of multiple devices used to process a substrate contributed to a fingerprint of a processing parameter for that substrate. In other words, the dominating frequency and/or coherence time may be used to determine a root cause of errors. Root cause investigation may use temporal evolution as a key performance indicator. For example, by comparing temporal evolution of certain fingerprint within one process parameter (such as overlay or EPE) to evolution of another process parameter, e.g. temperature or voltage of an etching chamber. A significant correlation can isolate the root cause of the fingerprint and thus be used to identify which of the multiple devices has contributed to the fingerprint of the processing parameter of the substrate.

A system comprising a processor configured to implement the steps of the methods described above may be provided. The processor is configured to generate a control scheme for devices configured to process and/or measure at least one substrate and/or determine, for a substrate processed by multiple devices, which of the multiple devices contributed to a fingerprint of a processing parameter of said substrate. The processor is configured to carry out the method according to any one of the embodiments above. The processor may be part of, or connected to, either the automated process control (APC) system and/or the supervisory control system.

The processor may be configured to determine a control scheme for a device configured to process and/or measure at least one substrate, the processor being configured to: obtain a fingerprint model and an evolution model, wherein the fingerprint model is based on fingerprint data for a processing parameter of at least one substrate processed by a device, and the evolution model represents variation of the fingerprint data over time; and analyse the fingerprint model and the evolution model. The processor may be configured to generate a sampling control scheme for the device using the analysis, wherein the sampling scheme provides an indication for where and when to take measurements on substrates processed by the device and/or generate a processing control scheme for the device using the analysis, wherein the processing control scheme provides an indication for how to control the substrate and/or processing of the substrate; and/or determine, for a substrate processed by multiple devices, which of the multiple devices contributed to a fingerprint of a processing parameter using the analysis and known processing parameter information of the multiple devices.

In the present invention, a computer program may be provided comprising computer readable instructions which, when run on a suitable computer controlled system, cause the computer controlled system to perform the methods described above. The computer program may be provided containing one or more sequences of machine-readable instructions describing methods of determining a control scheme for a device used to process and/or measure at least one substrate. Any of the above methods may be implemented using a computer program containing one or more sequences of machine-readable instructions. There may also be provided a data storage medium (e.g., semiconductor memory, magnetic or optical disk) having such a computer program stored therein.

A program is provided for controlling determining a control scheme for a device configured to process and/or measure at least one substrate and/or determining, for a substrate processed by multiple devices, which of the multiple devices contributed to a fingerprint of a processing parameter of said substrate. The program may comprise instructions for carrying out the steps of: obtaining a fingerprint model and an evolution model, wherein the fingerprint model is based on fingerprint data for a processing parameter of at least one substrate processed by a device, and the evolution model represents variation of the fingerprint data over time; and analyzing the fingerprint model and the evolution model. The computer program may comprise the steps of generating a sampling control scheme for the device using the analysis, wherein the sampling scheme provides an indication for where and when to take measurements on substrates processed by the device, and/or generating a processing control scheme for the device using the analysis, wherein the processing control scheme provides an indication for how to control the substrate and/or processing of the substrate, and/or determining, for a substrate processed by multiple devices, which of the multiple devices contributed to a fingerprint of a processing parameter using the analysis and known processing parameter information of the multiple devices. The program may comprise instructions for carrying out the steps of any of the methods described above.

The computer program may be executed for example within the control unit LACU of FIG. 1, or some other controller, for example within a metrology system that includes the metrology apparatus 140, or in an advanced process control system or separate advisory tool. The program may optionally be stored in a memory which is part of or can be accessed by the automated process control (APC) system and/or the supervisory control system.

Further embodiments of the invention are disclosed in the list of numbered embodiments below:

1. A method of determining a sampling scheme for substrates processed by a device, the method comprising:
    obtaining a fingerprint model and an evolution model, wherein the fingerprint model is based on fingerprint data for a processing parameter of at least one substrate processed by a device, and the evolution model represents variation of the fingerprint data over time;
    analyzing the fingerprint model and the evolution model and generating a sampling scheme for the device using the analysis, wherein the sampling scheme provides an indication for where and when to take measurements on substrates processed by the device.
2. The method of embodiment 1, further comprising processing at least one substrate and taking measurements of the at least one substrate according to the sampling scheme, the measurements relating to the processing parameter of the at least one substrate.
3. The method of embodiment 2, further comprising adjusting a setting of the device, using the measurements of the at least one substrate, to alter the impact of the device on the processing parameter.

4. The method of embodiment 2, further comprising:
updating the fingerprint model and/or the evolution model using the measurements of the at least one substrate;
analyzing the updated fingerprint model and/or the updated evolution model and generating an updated sampling scheme for the device using the analysis.

5. The method of embodiment 4, further comprising adjusting a setting of the device, using the updated fingerprint model and/or the updated evolution model, to alter the impact of the device on the processing parameter.

6. The method of any preceding embodiment, wherein obtaining the fingerprint model includes generating the fingerprint model based on measurements and/or fingerprint data, relating to the processing parameter, of at least one substrate having been processed by the device and/or at least one further device.

7. The method of any preceding embodiment, wherein obtaining the evolution model for the processing parameter includes generating the evolution model by comparing measurements and/or fingerprint data at a first time instance with measurements and/or fingerprint data at a second time instance, the measurements and/or fingerprint data relating to the processing parameter.

8. The method of any preceding embodiment, wherein the sampling scheme takes account of at least one additional factor, optionally the at least one additional factor includes an expected timescale for carrying out maintenance on the device, context data relating to the device used to process the substrate, and/or measurement data relating to the condition of the device.

9. The method of any preceding embodiment, wherein multiple fingerprint models and evolution models are obtained for the device relating to multiple processing parameters, and wherein an individual sampling scheme is determined for different ones of the multiple processing parameters.

10. The method of any preceding embodiment, wherein the fingerprint model is derived by subtracting a fingerprint associated with a further device from a fingerprint obtained by measurement of the processing parameter on a substrate processed by the device and the further device.

11. The method of any preceding embodiment, wherein the fingerprint model is derived by determining a contribution of the device to a fingerprint of a processing parameter using a method of obtaining processing parameter data and usage data, wherein the processing parameter data is based on measurements for multiple substrates having been processed by a plurality of devices, and the usage data indicates which of the devices out of the plurality of the devices were used in the processing of each substrate; and determining the contribution using the usage data and processing parameter data.

12. The method of any preceding embodiment, wherein the fingerprint model comprises at least two fingerprint sub-models, each fingerprint sub-model associated with a different spatial scale of variation across the substrates.

13. The method of embodiment 12, wherein the generating of the sampling scheme is based on at least one of the fingerprint sub-models.

14. The method of embodiments 12 or 13, wherein the evolution model comprises at least two evolution sub-models, each evolution sub-model associated with a specific fingerprint sub-model.

15. The method of embodiment 14, wherein the generating of the sampling scheme is based on at least one of the evolution sub-models.

16. The method of any preceding embodiment, wherein the evolution model is dynamically updated.

17. The method of embodiment 16, wherein the fingerprint model and/or evolution model is updated based on machine learning.

18. The method of any preceding embodiment, wherein the fingerprint model is dynamically updated.

19. The method of embodiment 18, wherein the fingerprint model is updated based on machine learning.

20. A computer program comprising computer readable instructions which, when run on a suitable computer apparatus, cause the computer apparatus to perform the method of any of embodiments 1 to 19.

21. A system comprising a processor configured to carry out the steps of the methods disclosed in any of embodiments 1 to 19.

22. A method of determining a control scheme for a device configured to process and/or measure at least one substrate, the method comprising:
obtaining a fingerprint model and an evolution model, wherein the fingerprint model is based on fingerprint data for a processing parameter of at least one substrate processed by a device, and the evolution model represents variation of the fingerprint data over time;
analyzing the fingerprint model and the evolution model; and
a) generating a sampling control scheme for the device using the analysis, wherein the sampling control scheme provides an indication for where and when to take measurements on substrates; and/or
b) generating a processing control scheme for the device using the analysis, wherein the processing control scheme provides an indication for how to control the processing of the substrate.

23. The method of embodiment 22, further comprising processing at least one substrate and taking measurements of the at least one substrate according to the sampling control scheme, the measurements relating to the processing parameter of the at least one substrate.

24. The method of embodiment 23, further comprising adjusting a setting of the device, using the measurements of the at least one substrate, to alter the impact of the device on the processing parameter.

25. The method of embodiment 23, further comprising:
updating the fingerprint model and/or the evolution model using the measurements of the at least one substrate;
analyzing the updated fingerprint model and/or the updated evolution model and generating an updated sampling control scheme and/or processing control scheme for the device using the analysis.

26. The method of embodiment 25, further comprising adjusting a setting of the device, using the updated fingerprint model and/or the updated evolution model, to alter the impact of the device on the processing parameter.

27. The method of any of embodiments 22 to 26, wherein the sampling control scheme and/or processing control scheme takes account of at least one additional factor, optionally the at least one additional factor includes an expected timescale for carrying out maintenance on the device, context data relating to the device used to process the substrate, and/or measurement data relating to the condition of the device.

28. The method of any of embodiments 22 to 27, wherein multiple fingerprint models and evolution models are obtained for the device relating to multiple processing parameters, and wherein an individual sampling control scheme and/or processing control scheme is determined for different ones of the multiple processing parameters.

29. The method of any of embodiments 22 to 28, wherein an indication for how to control the processing of the substrate comprises a preferred setting for position control of the substrate and/or a preferred setting of a lens manipulator of the device, a preferred setting for controlling the shape of the substrate, and/or the indication comprises information for adjusting at least one device used to process the substrate, preferably, information used to adjust a lens in a lithographic apparatus used to process the substrate.

30. The method of any of embodiments 22 to 29, further comprising controlling processing of the substrate using the indication.

31. The method of any of embodiments 22 to 30, wherein the fingerprint model comprises at least two fingerprint sub-models, each fingerprint sub-model associated with a different spatial scale of variation across the substrates.

32. The method of embodiment 31, wherein the generating of the sampling control scheme and/or the processing control scheme is based on at least one of the fingerprint sub-models.

33. The method of embodiment 31 or 32, wherein the evolution model comprises at least two evolution sub-models, each evolution sub-model associated with a specific fingerprint sub-model.

34. The method of embodiment 33, wherein the generating of the sampling control scheme and/or the processing control scheme is based on at least one of the evolution sub-models.

35. The method of embodiment 34, wherein the fingerprint model and/or evolution model is dynamically updated based on machine learning.

36. The method of any of embodiments 22 to 35, further comprising a step of decomposing the fingerprint data to generate at least one set of component data, wherein the fingerprint model comprises the at least one set of component data.

37. The method of embodiment 36, wherein the evolution model is based on variation of the at least one set of component data over time.

38. The method of embodiment 37, further comprising:
transforming the evolution model of the at least one set of component data;
identifying a dominating frequency for the transformed evolution model; and
determining a coherence time of the at least one set of component data, wherein the coherence time is inversely proportional to the dominating frequency.

39. The method of embodiment 38, wherein the sampling control scheme and/or the processing control scheme is generated using the coherence time of the at least one set of component data.

40. The method of embodiment 38 or 39, wherein the dominating frequency and/or coherence time of the at least one set of component data is compared to known processing parameter information for multiple devices used to process a substrate and by comparison of the processing parameter information and the dominating frequency and/or coherence time, it can be determined which of the multiple devices contributed to a fingerprint of a processing parameter for that substrate.

41. The method of any one of embodiments 22 to 40, further comprising the steps of determining, for a substrate processed by multiple devices, which of the multiple devices contributed to a fingerprint of a processing parameter of said substrate using the analysis and known processing parameter information of the multiple devices.

42. A method of determining, for a substrate processed by multiple devices, which of the multiple devices contributed to a fingerprint of a processing parameter of said substrate, the method comprising:
obtaining a fingerprint model and an evolution model, wherein the fingerprint model is based on fingerprint data for a processing parameter of at least one substrate processed by a device, and the evolution model represents variation of the fingerprint data over time;
analyzing the fingerprint model and the evolution model; and determining, for a substrate processed by multiple devices, which of the multiple devices contributed to a fingerprint of a processing parameter of said substrate using the analysis and known processing parameter information of the multiple devices.

43. The method of embodiment 42, wherein the fingerprint model comprises at least two fingerprint sub-models, each fingerprint sub-model associated with a different spatial scale of variation across the substrates.

44. The method of embodiment 43, wherein the determining which of the multiple devices contributed to a fingerprint is based on at least one of the fingerprint sub-models.

45. The method of embodiment 43 or 44, wherein the evolution model comprises at least two evolution sub-models, each evolution sub-model associated with a specific fingerprint sub-model.

46. The method of embodiment 45, wherein the determining which of the multiple devices contributed to a fingerprint is based on at least one of the evolution sub-models.

47. The method of embodiment 46, wherein the fingerprint model and/or evolution model is dynamically updated based on machine learning.

48. The method of any one of embodiments 42 to 47, further comprising a step of decomposing the fingerprint data to generate at least one set of component data, wherein the fingerprint model comprises the at least one set of component data.

49. The method of embodiment 48, wherein the evolution model is based on variation of the at least one set of component data over time.

50. The method of embodiment 49, further comprising:
transforming the evolution model of the at least one set of component data;
identifying a dominating frequency for the transformed evolution model; and
determining a coherence time of the at least one set of component data, wherein the coherence time is inversely proportional to the dominating frequency.

51. The method of embodiment 50, wherein the sampling control scheme and/or the processing control scheme is generated using the coherence time of the at least one set of component data.

52. The method of embodiment 50 or 51, wherein the dominating frequency and/or coherence time of the at least one set of component data is compared to known processing parameter information for multiple devices used to process a substrate and by comparison of the processing parameter information and the dominating frequency and/or coherence time, it can be determined which of the multiple devices contributed to a fingerprint of a processing parameter for that substrate.

53. The method of any one of embodiments 42 to 52, wherein for the device from the multiple devices which is determined as having contributed to a fingerprint of a processing parameter of said substrate, the method further comprises adjusting the settings for said device based on the determined contribution.

54. The method of any of embodiments 22 to 53, wherein obtaining the evolution model for the processing parameter includes generating the evolution model by comparing measurements and/or fingerprint data at a first time instance with measurements and/or fingerprint data at a second time instance, the measurements and/or fingerprint data relating to the processing parameter.

55. The method of any of embodiments 22 to 54, wherein the fingerprint model is derived by subtracting a fingerprint associated with a further device from a fingerprint obtained by measurement of the processing parameter on a substrate processed by the device and the further device.

56. The method of any of embodiments 22 to 55, wherein the fingerprint model is derived by determining a contribution of the device to a fingerprint of a processing parameter using a method of obtaining processing parameter data and usage data, wherein the processing parameter data is based on measurements for multiple substrates having been processed by a plurality of devices, and the usage data indicates which of the devices out of the plurality of the devices were used in the processing of each substrate; and determining the contribution using the usage data and processing parameter data.

57. A computer program comprising computer readable instructions which, when run on a suitable computer controlled system, cause the computer controlled system to implement the method of any of embodiments 1 to 56.

58. A system comprising a processor configured to implement the steps of the methods disclosed in any of embodiments 1 to 56.

59. The method of embodiment 1, wherein the sampling scheme comprises a plurality of metrology system specific sampling schemes indicating where and when to take measurements on substrates processed by the device by each metrology system out of a plurality of metrology systems.

60. The method of embodiment 59, wherein a first metrology system specific sampling scheme provides an indication that measurements by a first metrology system are either not needed or only needed to be performed at a very low temporal frequency based on an expected stability of a fingerprint derived from the fingerprint model and the evolution model.

61. The method of embodiment 59 or 60, wherein a first metrology system specific sampling scheme and a second metrology system specific sampling scheme are co-optimized based on an expected relevance of: a) measurements associated with the first metrology system and b) measurements associated with the second metrology system.

62. The method of embodiment 61, wherein the co-optimization is performed per layer applied to the substrates processed by the device.

63. The method of embodiment 60, wherein the indication is provided per layer applied to the substrates processed by the device.

64. The method of any embodiment of embodiments 59 to 63, wherein the plurality of metrology systems comprise at least an alignment sensor and a level sensor.

65. The method of embodiment 61, wherein the first metrology system is an alignment sensor and the second metrology system is a level sensor.

The invention claimed is:

1. A method comprising:
   obtaining a fingerprint computer model and an evolution computer model, wherein the fingerprint model is based on measured fingerprint data for a substrate processing parameter, and the evolution model represents variation of the fingerprint data over time;
   analyzing, by a hardware computer system, the fingerprint model and the evolution model; and
   a) generating a sampling control scheme for a substrate measuring device using the analysis, wherein the sampling control scheme provides an indication for where and when to take measurements on substrates, and/or
   b) generating a processing control scheme for a substrate processing device using the analysis, wherein the processing control scheme provides an indication for how to control processing of substrates.

2. The method of claim 1, comprising the generating the sampling control scheme and further comprising processing at least one substrate and taking measurements of the at least one substrate according to the sampling control scheme, the measurements relating to the substrate processing parameter.

3. The method of claim 2, further comprising:
   updating the fingerprint model and/or the evolution model using the measurements of the at least one substrate; and
   analyzing the updated fingerprint model and/or the updated evolution model and generating an updated sampling control scheme and/or processing control scheme for the device using the analysis.

4. The method of claim 1, wherein the sampling control scheme and/or processing control scheme takes account of at least one additional factor, the at least one additional factor including an expected timescale for carrying out maintenance on the device, context data relating to substrate processing, measurement data relating to the condition of the device and/or a known relationship between measurements taken by different measurement tools.

5. The method of claim 1, wherein multiple fingerprint models and evolution models are obtained relating to multiple processing parameters, and wherein an individual sampling control scheme and/or processing control scheme is determined for different ones of the multiple processing parameters.

6. The method of claim 1, wherein the fingerprint model comprises at least two fingerprint sub-models, each fingerprint sub-model associated with a different spatial scale of variation across the substrates.

7. The method of claim 6, wherein the evolution model comprises at least two evolution sub-models, each evolution sub-model associated with a specific fingerprint sub-model.

8. The method of claim 6, wherein the generating of the sampling control scheme and/or the processing control scheme is based on at least one of the fingerprint sub-models and/or on at least one of at least two evolution sub-models, each evolution sub-model associated with a specific fingerprint sub-model.

9. The method of claim 1, further comprising decomposing the fingerprint data to generate at least one set of component data, wherein the fingerprint model comprises the at least one set of component data and wherein the evolution model is based on variation of the at least one set of component data over time.

10. The method of claim 9, further comprising:
    transforming the evolution model of the at least one set of component data;

identifying a dominating frequency for the transformed evolution model; and determining a coherence time of the at least one set of component data, wherein the coherence time is inversely proportional to the dominating frequency.

11. The method of claim 10, wherein the sampling control scheme and/or the processing control scheme is generated using the coherence time of the at least one set of component data.

12. The method of claim 10, wherein the dominating frequency and/or coherence time of the at least one set of component data is compared to known processing parameter information for multiple devices used to process a particular substrate and by comparison of the processing parameter information and the dominating frequency and/or coherence time, it can be determined which of the multiple devices contributed to a fingerprint of a processing parameter for that substrate.

13. The method of claim 1, comprising the generating the sampling control scheme and wherein the sampling control scheme comprises a plurality of metrology system specific sampling schemes indicating where and when to take measurements on substrates by each metrology system out of a plurality of metrology systems.

14. The method of claim 13, wherein a metrology system specific sampling scheme of the plurality of metrology system specific sampling schemes provides an indication that measurements by a metrology system of the plurality of metrology systems are either not needed or only needed to be performed at a very low temporal frequency based on an expected stability of a fingerprint derived from the fingerprint model and the evolution model.

15. The method of claim 14, wherein the indication is provided per layer applied to the substrates.

16. The method of claim 13, wherein a first metrology system specific sampling scheme and a second metrology system specific sampling scheme of the plurality of metrology system specific sampling schemes are co-optimized based on an expected relevance of: a) measurements associated with a first metrology system of the plurality of metrology systems and b) measurements associated with a second metrology system of the plurality of metrology systems.

17. The method of claim 16, wherein the co-optimization is performed per layer applied to the substrates.

18. The method of claim 16, wherein the first metrology system is an alignment sensor and the second metrology system is a level sensor.

19. The method of claim 13, wherein the plurality of metrology systems comprise at least an alignment sensor and a level sensor.

20. A method of determining, for a substrate processed by multiple devices, which of the multiple devices contributed to a fingerprint of a processing parameter of the substrate, the method comprising:

obtaining a fingerprint computer model and an evolution computer model, wherein the fingerprint model is based on measured fingerprint data for a processing parameter of at least one substrate, and the evolution model represents variation of the fingerprint data over time;

analyzing, by a hardware computer system, the fingerprint model and the evolution model; and determining, for a substrate processed by multiple devices, which of the multiple devices contributed to a fingerprint of a processing parameter of the substrate using the analysis and known processing parameter information of the multiple devices.

21. A non-transitory computer-readable medium having instructions therein, the instructions, upon execution by a computer system, configured to cause the computer system to at least:

obtain a fingerprint computer model and an evolution computer model, wherein the fingerprint model is based on measured fingerprint data for a substrate processing parameter, and the evolution model represents variation of the fingerprint data over time;

analyze the fingerprint model and the evolution model; and a) generate a sampling control scheme for a substrate measuring device using the analysis, wherein the sampling control scheme provides an indication for where and when to take measurements on substrates, and/or b) generate a processing control scheme for a substrate processing device using the analysis, wherein the processing control scheme provides an indication for how to control processing of substrates.

22. A non-transitory computer-readable medium having instructions therein, the instructions, upon execution by a computer system, configured to cause the computer system to at least:

obtain a fingerprint computer model and an evolution computer model, wherein the fingerprint model is based on measured fingerprint data for a processing parameter of at least one substrate, and the evolution model represents variation of the fingerprint data over time;

analyze the fingerprint model and the evolution model; and determine, for a substrate processed by multiple devices, which of the multiple devices contributed to a fingerprint of a processing parameter of the substrate using the analysis and known processing parameter information of the multiple devices.

* * * * *